United States Patent
Chapman

(10) Patent No.: US 7,506,289 B1
(45) Date of Patent: *Mar. 17, 2009

(54) APPROACH FOR ROUTING AN INTEGRATED CIRCUIT

(76) Inventor: David C. Chapman, 2655 Keystone Ave., #41, Santa Clara, CA (US) 95051

( * ) Notice: Subject to any disclaimer, the term of this patent is extended or adjusted under 35 U.S.C. 154(b) by 202 days.

This patent is subject to a terminal disclaimer.

(21) Appl. No.: 11/450,053

(22) Filed: Jun. 9, 2006

Related U.S. Application Data

(63) Continuation of application No. 09/421,437, filed on Oct. 19, 1999, now Pat. No. 7,065,729.

(60) Provisional application No. 60/139,532, filed on Jun. 16, 1999, provisional application No. 60/104,872, filed on Oct. 19, 1998.

(51) Int. Cl.
  *G06F 17/50* (2006.01)
(52) U.S. Cl. ............... 716/5; 716/13; 716/14; 716/9; 716/10
(58) Field of Classification Search ........ 716/5, 716/13, 14, 9, 10
See application file for complete search history.

(56) References Cited

U.S. PATENT DOCUMENTS

| | | | | |
|---|---|---|---|---|
| 5,258,920 | A | * | 11/1993 | Haller et al. ........ 716/12 |
| 5,801,959 | A | * | 9/1998 | Ding et al. ......... 716/11 |
| 5,987,240 | A | * | 11/1999 | Kay ................ 716/5 |
| 6,110,222 | A | * | 8/2000 | Minami et al. ...... 716/9 |

(Continued)

OTHER PUBLICATIONS

NA8406399, "Wire Routing With Path History Dependent Penalty Functions", IBM Technical Disclosure Bulletin, vol. 27, No. 1A, Jun. 1984, pp. 399-406, 9 pages.*

(Continued)

*Primary Examiner*—Phallaka Kik
(74) *Attorney, Agent, or Firm*—Hickman Palermo Truong & Becker LLP

(57) ABSTRACT

A computer-implemented approach for routing an integrated circuit using non-orthogonal routing is accomplished during two phases: a global routing phase and a detailed routing phase. During global routing, routing indicators, in the form of hint polygons, are added to the integrated circuit layout and strategy lists, that include bias directions and straying limits, are generated for the new wires to be added. The hint polygons and strategy lists are used during detailed routing to aid in placing the new wires. If obstacle conflicts or insufficient space problems prevent the detailed routing of a new wire, then an obstacle resolution portion of global routing is used to resolve the obstacle conflict and/or provide additional space in the integrated circuit layout to route the new wires. Obstacle resolution includes, without limitation, moving or changing layout geometry, changing or add hint polygons, changing the routing strategy by changing the bias direction and/or adjusting straying limits, inserting one or more layer changes, instructing the detailed router to backup and insert a bend, ripping-up and rerouting one or more wires, or routing the wire from the destination connection point. Also, a tight routing approach may be employed to accommodate constructing routing paths in tight layout areas. Object specific design rule checks are employed to increase routing flexibility optimize routing performance. "On-the-fly" design rule checks are performed on portions of routing paths as the routing paths are being constructed.

38 Claims, 23 Drawing Sheets

U.S. PATENT DOCUMENTS

| | | | | |
|---|---|---|---|---|
| 6,122,443 | A * | 9/2000 | Nishikawa | 716/8 |
| 6,272,668 | B1 * | 8/2001 | Teene | 716/10 |
| 6,584,608 | B1 * | 6/2003 | Kumada et al. | 716/15 |
| 7,065,729 | B1 * | 6/2006 | Chapman | 716/13 |

OTHER PUBLICATIONS

Canada Intellectual Property Office, Office Action, foreign application No. 2,345,443, received Jun. 19, 2008, 2 pages.

Claims, PCT/US99/24454, 12 pages, filed Oct. 19, 1999.

* cited by examiner

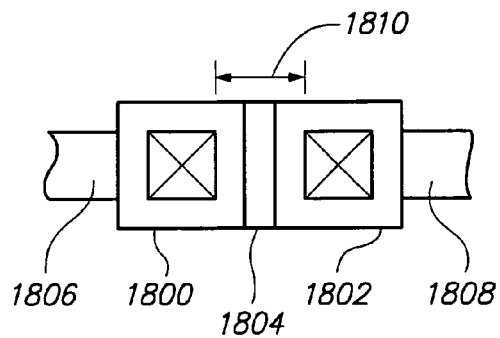
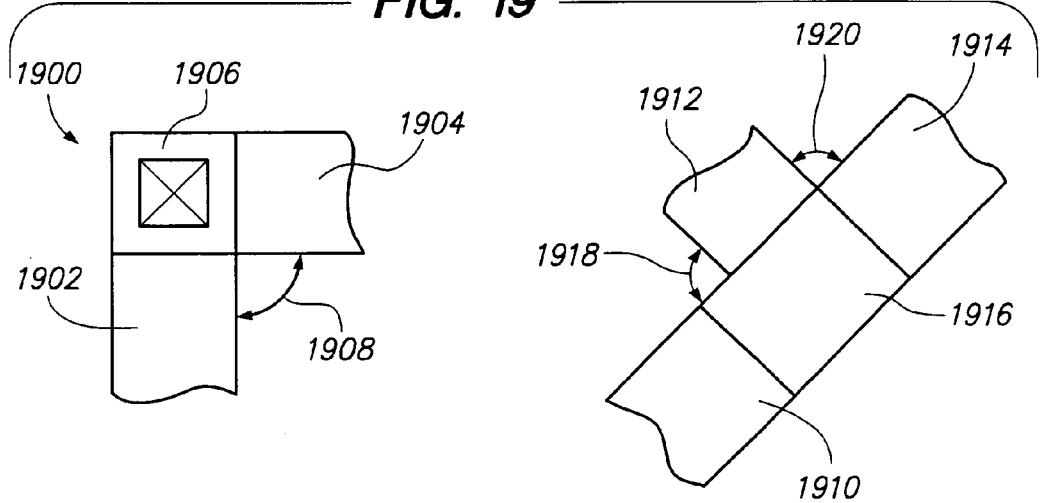
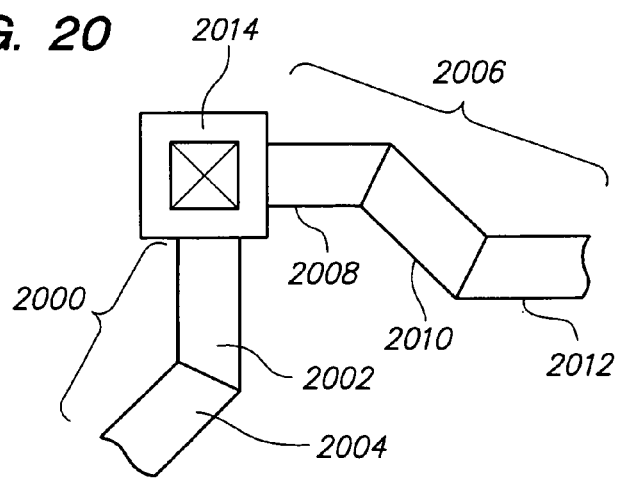

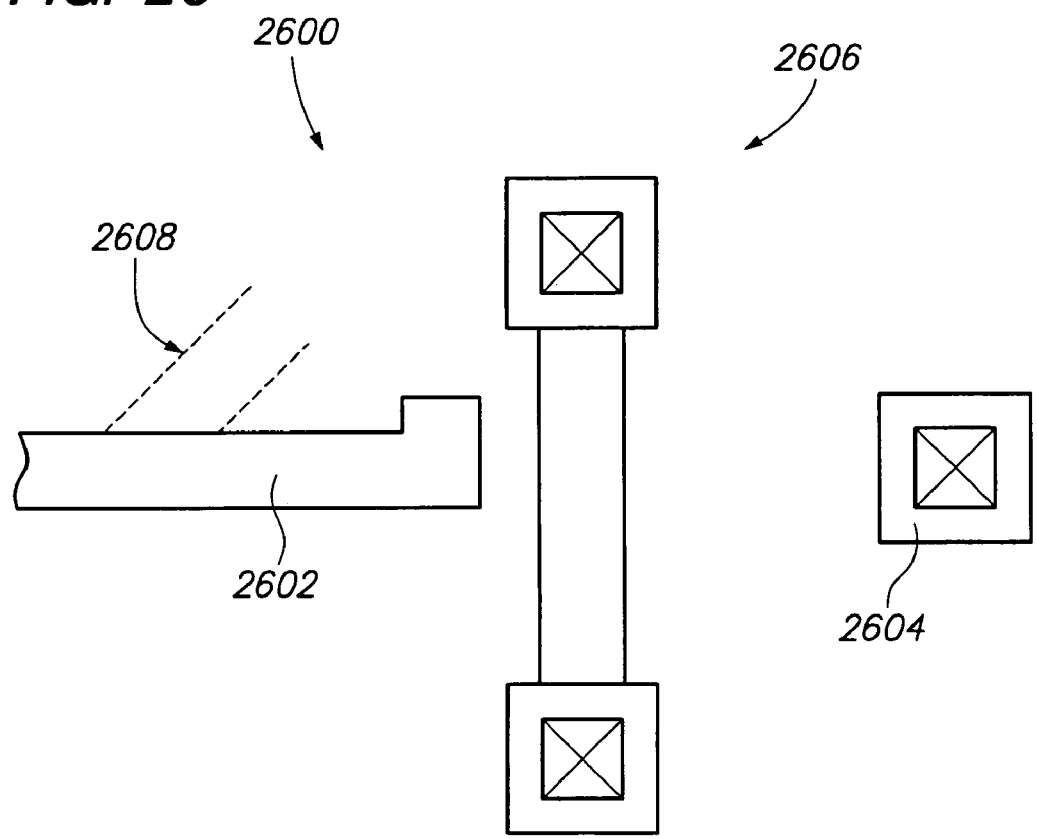

APPROACH FOR ROUTING AN INTEGRATED CIRCUIT

RELATED APPLICATIONS AND CLAIM OF PRIORITY

This application is a continuation of and claims priority to U.S. patent application Ser. No. 09/421,437 (now U.S. Pat. No. 7,065,729) filed on Oct. 19, 1999, entitled "APPROACH FOR ROUTING AN INTEGRATED CIRCUIT" and further claims priority to U.S. Provisional Application Ser. No. 60/104,872 filed on Oct. 19, 1998, entitled "ROUTING OF VLSI LAYOUTS.", and U.S. Provisional Application Ser. No. 60/139,532 filed on Jun. 16, 1999, entitled "ROUTING OF VLSI LAYOUTS PLUS", the contents of which are all hereby incorporated by reference in their entirety for all purposes as if fully set forth herein.

FIELD OF THE INVENTION

The present invention relates to integrated circuits, and more specifically, to an approach for routing an integrated circuit.

BACKGROUND OF THE INVENTION

Routing an integrated circuit involves determining the placement of wires to electrically connect integrated circuit devices and cells so that the integrated circuit operates correctly. For small integrated circuits, routing can be performed by a circuit designer who manually adds new wires to make the necessary connections in the integrated circuit. Often, the designer repositions devices and cells to make room for the new wires. Although manual routing can provide relatively compact designs, the manual approach is impractical for large integrated circuits containing millions of transistors.

For large integrated circuits, routing is performed automatically by a routing mechanism known as a "router" that is typically implemented as a software tool on a computer-aided design system. A router receives a data representation of the integrated circuit (a "layout") and the electrical connections to be made between devices and cells contained in the integrated circuit layout (a "netlist"). The router determines where to place new wires in the integrated circuit layout to make the specified connections. The placement of the new wires is important since the length and placement of the new wires can have a direct effect on the performance of the integrated circuit. After the router has determined where to place the new wires, the router updates the integrated circuit layout to reflect the new wires.

Routing is typically performed in two phases: global routing and detailed routing. Global routing generally involves determining the general placement of the new wires. Conventionally, a spanning tree is created to determine which pairs of points will be connected. One particular type of spanning tree is a Steiner tree, which allows for new points, referred to as Steiner points, that were not in the original list of connection points. The new points provide additional flexibility in connecting the pairs of points and can reduce the total wire length by 10 to 15%, thereby reducing signal transmission time.

During the detailed routing phase, the router implements the connection between each pair of points by adding the new wires. Ideally, all of the new wires would be implemented as straight lines between the specified connection points. However, the new wires usually have to be bent to avoid obstacles, i.e., devices and cells, in the layout. In addition, the angle between a given pair of points will not normally be an angle supported by the router (e.g., a multiple of ninety degrees for most current routers) and so at least one bend will be necessary to ensure that all components of the wire have a reasonable direction. Thus, various routing approaches are used to optimize the placement of the new wires. Two of these approaches include the channel routing approach and the area routing approach.

The channel routing approach generally involves converting the two-dimensional area routing problem into a series of one-dimensional channel routing problems. For a description of the channel routing approach, see *Introduction to CAD for VLSI*, First Edition (1987), by Stephen M. Trimberger, Kluwer Academic Publishers, Boston, ISBN 0-89838-231-9.

In the channel routing approach, the router chooses the channels in which the new wires travel horizontally and the slots in which the new wires travel vertically between channels. Many of these choices are based upon the placement of the standard cells in the rows. The channel router then optimizes the usage of horizontal routing tracks in an attempt to minimize the height of the channel. Even this is NP-hard, so most channel routers impose a constraint that each net in the channel have a single horizontal spine in a single routing track. Under this constraint, each track is assigned to a different net at each slot location using a graph coloring algorithm. Horizontal wires are routed in one layer and vertical wires are routed in a second layer. If more layers are available, the layers typically alternate directions. Most commercial routers use some form of channel router to perform detailed routing and then compact the channel to simulate having multiple spines per net. FIG. 1A is a block diagram of a portion of an integrated circuit layout 100 that requires a channel with three routing tracks. FIG. 1B is a block diagram of a portion of an integrated circuit layout 150 that requires a channel with four routing tracks. The channel has been compacted so that it uses space equivalent to three routing tracks.

The primary benefit of the channel routing approach is simplicity, albeit at the expense of size and flexibility. However, the channel routing approach is not without its disadvantages. Specifically, the channel routing approach becomes impractical or impossible if there are significant numbers of obstacles extending into the channel, or if pins and/or obstacles are in the middle of the routing area, or if there are pin connections on all four sides of the region to be routed (which greatly increases the difficulty of assigning tracks for spines).

The classic area router is the Lee Router, also known as a Maze Router, which routes one wire at a time by progressively searching all grid locations between the pair of points being routed. If there is a way to connect the points, the Lee Router will find the most efficient way, but the number of locations to be searched is very large (especially if more than one routing layer can be used). As a result, area routers are generally more powerful than their channel router counterparts, but they tend to require substantially more computational resources to operate and are more difficult to implement. For large integrated circuits, area routers can be impractical. See "Chip Level Area Routing," Le-Chin Eugene Liu et al., Proceedings of the 1998 International Symposium on Logic Design, pp. 197-204. Note that the authors split the die into smaller regions for area routing.

FIG. 2 is a block diagram 200 that illustrates how a "wave front" type search is used to establish a path 202 from a source pin 204 to a destination pin 206 around an obstacle 208. For each point on the wave front, defined by an x-axis 210 and a y-axis 212, four adjacent grid locations must be tested to see if they have been traversed, are obstacles, or have been used in a different wire. Line 214 represents the locus of points eighteen units from source pin 204. Every untraversed, unused, non-obstacle location must then be added to the next wave front. Choosing a smaller grid will result in many more locations to be examined, so the router typically works on a grid that is the size of the contact routing pitch.

FIGS. 3A and 3B are block diagrams 300 and 350, respectively, that illustrate the wasted space induced by the use of a routing grid in a router, such as an area router or a channel router. Wires without contacts typically require 10 to 20% less space. As a result, a routing grid based upon wires having contacts can waste a significant amount of space. In FIG. 3A, wires 302 and 304, each 0.5 lambda wide (the particular units are immaterial), have a pitch of 1.25 lambda, because of the minimum required spacing of 0.5 lambda between contact 306 and contact 308. In contrast, the wires 352 and 354 of FIG. 3B have a pitch of 1.0 lambda, since wires 352 and 354 do not have contacts.

It is important to note that if a Lee Router is implemented with multiple routing layers, then each point in the wave front has even more possibilities: left, right, up, down, go to the next routing layer if any, or go to the previous routing layer if any. Any sequential router such as the Lee Router must also concern itself with interference between the individual wires. Completing one wire may well block another. Because an optimal routing order is generally not known in advance, area routers typically must implement some form of rip-up and reroute, in which some number of existing wires are removed, another wire drawn, and the ripped-up wires redrawn. This may lead to still more blockages, requiring further rerouting. In the worst case the area router might not be able to find a feasible solution for all wires.

Many enhancements have been suggested to the basic Lee Router. See, for example, *Combinatorial Algorithms for Integrated Circuit Layout*, by Thomas Lengauer, John Wiley & Sons Ltd., England, ISBN 0-471-92838-0). It is noteworthy that these enhancements are restricted to orthogonal routing and mostly require the use of a coarse routing grid.

Commercial integrated circuit routing tools sometimes use a channel routing mechanism first and then an area routing mechanism to complete unroutes or to implement small changes in the circuit after it has been built once already (i.e. Engineering Change Orders or ECOs), when it is advantageous to minimize the number of production mask levels that must be changed. Unroutes are typically short sections of connecting wires that could not be completed with a channel router due to underestimation of resource requirements. In these situations, adding a track in a channel would force all transistor rows to be moved apart, requiring that all mask levels be rebuilt.

A significant limitation with conventional routing approaches, including both the channel routing approach and the area routing approach, is the inability to modify the geometry around a wire being defined. There are several reasons for this limitation. One reason is that many conventional routers are strictly inter-cell routers that connect predefined cells only. Another reason is that most conventional routing approaches use only orthogonal geometry for wires and geometry changes such as clipping the corner of an enclosure do not provide a benefit unless the wire passing it is non-orthogonal. A third reason is that non-orthogonal wires do not efficiently fit onto a coarse routing grid, requiring either a wasteful grid size or a "gridless" router. Although some gridless routers have been designed, none of them are capable of routing non-orthogonal wires. Non-orthogonal routing can reduce overall wire length by up to 7% compared to orthogonal routing, resulting in both area savings and delay reductions.

Therefore, based on the need to route connections in integrated circuits and the limitations in the prior approaches, an approach for automatically routing an integrated circuit that does not suffer from limitations inherent in conventional routing approaches is highly desirable.

SUMMARY OF THE INVENTION

According to one aspect of the invention a computer-implemented approach is provided for automatically routing an integrated circuit. According to the approach, integrated circuit layout data is received that defines a set of two or more integrated circuit devices to be included in the integrated circuit. Integrated circuit connection data is also received that specifies one or more electrical connections to be made between the integrated circuit devices. A set of one or more routing indicators that indicate a set of one or more preferable intermediate routing locations for a routing path between first and second integrated circuit devices from the set of two or more integrated circuit devices is determined based upon the integrated circuit layout data and the integrated circuit connection data. The routing path is determined between the first and second integrated circuit devices based upon the integrated circuit layout data, the integrated circuit connection data and the set of one or more routing indicators, wherein the routing path satisfies specified design criteria. Finally, the integrated circuit layout data is updated to generate updated integrated circuit layout data that reflects the routing path between the first and second integrated circuit devices.

According to another aspect of the invention, a routing strategy is employed for each routing path that includes a routing bias direction and a straying limit that constrains the routing of a routing path to a specified routing region.

According to another aspect of the invention, one or more changes are made to one or more layout objects to accommodate the routing of the routing path. These changes include, without limitation, moving layout objects and clipping corners of layout objects.

According to another aspect of the invention, obstacle resolution is employed to accommodate the routing of the routing path. Obstacle resolution includes, without limitation, changing or adding hint polygons, changing the routing strategy by changing the bias direction and/or adjusting straying limits, inserting one or more layer changes, instructing the detailed router to backup and insert a bend, ripping-up and rerouting the wire, or route the wire from the destination connection point. Also, a tight routing approach may be employed to accommodate constructing routing paths in tight layout areas.

According to another embodiment of the invention, "on-the-fly" design rule checks are performed on portions of routing paths as the routing paths are being constructed. Furthermore, layout object-specific design rule checks may be employed.

BRIEF DESCRIPTION OF THE DRAWINGS

Embodiments of the invention are illustrated by way of example, and not by way of limitation, in the figures of the accompanying drawings and in which like reference numerals refer to similar elements and in which:

FIG. 18 is a block diagram illustrating the use of short path indicators during design rule checking according to an embodiment of the invention;

FIG. 19 is a block diagram illustrating performing a routing path design rule check according to an embodiment of the invention;

FIG. 20 is a block diagram illustrating performing a routing path design rule check according to an embodiment of the invention;

FIG. 26 is a block diagram illustrating an approach for resolving an obstacle conflict by instructing detailed routing to backup and insert a bend in a routing path according to an embodiment of the invention.

DETAILED DESCRIPTION OF THE INVENTION

In the following description, for the purposes of explanation, specific details are set forth in order to provide a thorough understanding of the invention. However, it will be apparent that the invention may be practiced without these specific details. In other instances, well-known structures and devices are depicted in block diagram form in order to avoid unnecessarily obscuring the invention.

Various aspects and features of example embodiments of the invention are described in more detail hereinafter in the following sections: (1) introduction; (2) functional overview; (3) applicable principals; (4) global routing; (5) detailed routing; (6) obstacle and insufficient space resolution; and (7) implementation mechanisms.

1. Introduction

A computer-implemented approach for routing an integrated circuit using non-orthogonal routing is described. The approach is applicable to both intra-cell and inter-cell applications and can be adapted for use with orthogonal routing when the process design rules for routing and contact layers become too difficult to manage using conventional routers. In general, routing is accomplished during two phases: a global routing phase and a detailed routing phase. During global routing, hint polygons are added to the integrated circuit layout and strategy lists are generated for the new wires to be added. The hint polygons and strategy lists are used during detailed routing to aid in placing the new wires. If obstacle conflicts or insufficient space problems prevent the detailed routing of a new wire, then an obstacle resolution portion of global routing is used to resolve the obstacle conflict and/or provide additional space in the integrated circuit layout to route the new wires. Thus, major changes are generally made during global routing to simplify the detailed routing.

2. Functional Overview

Figure 1A:
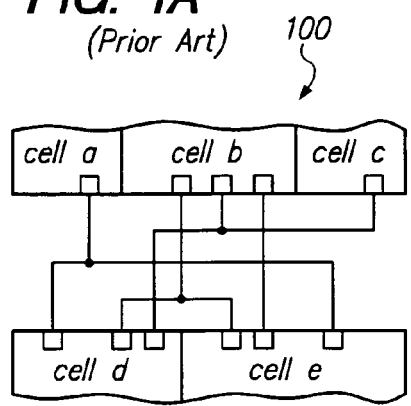
FIG. 1A is a block diagram of a portion of an integrated circuit layout that requires a channel with three routing tracks.
Figure 1B:
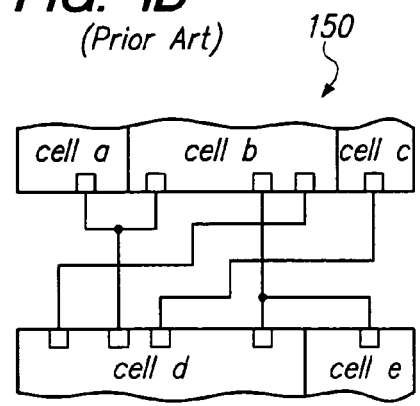
FIG. 1B is a block diagram of a portion of an integrated circuit layout that requires a channel with four routing tracks.
Figure 2:
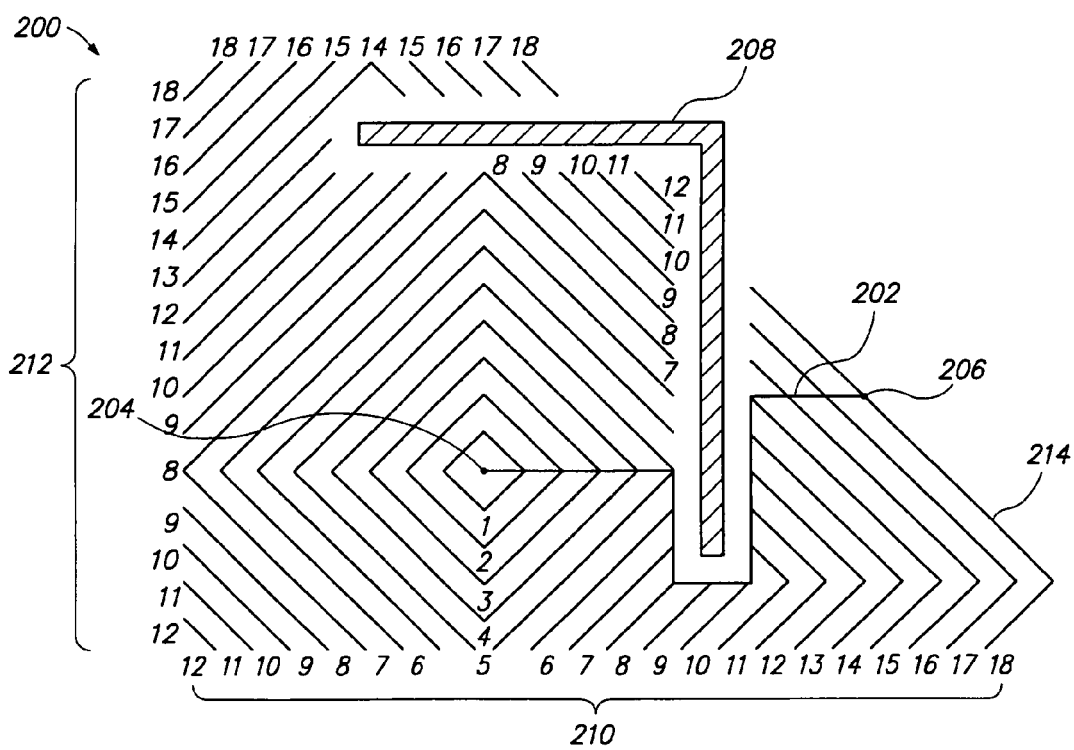
FIG. 2 is a block diagram illustrating how a "wave front" type search is used to establish a path from a source pin to a destination pin around an obstacle.
Figure 3A:
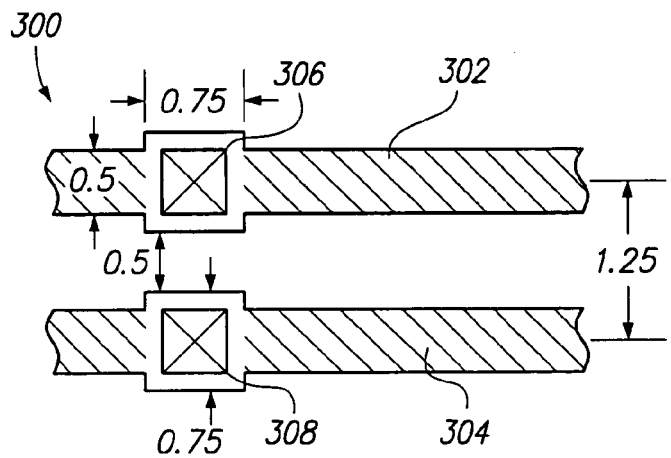
FIGS. 3A and 3B are block diagrams illustrating the wasted space induced by the use of a routing grid in a router, such as an area router or a channel router.
Figure 3B:
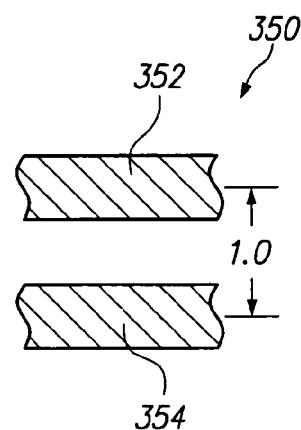
Figure 4A:
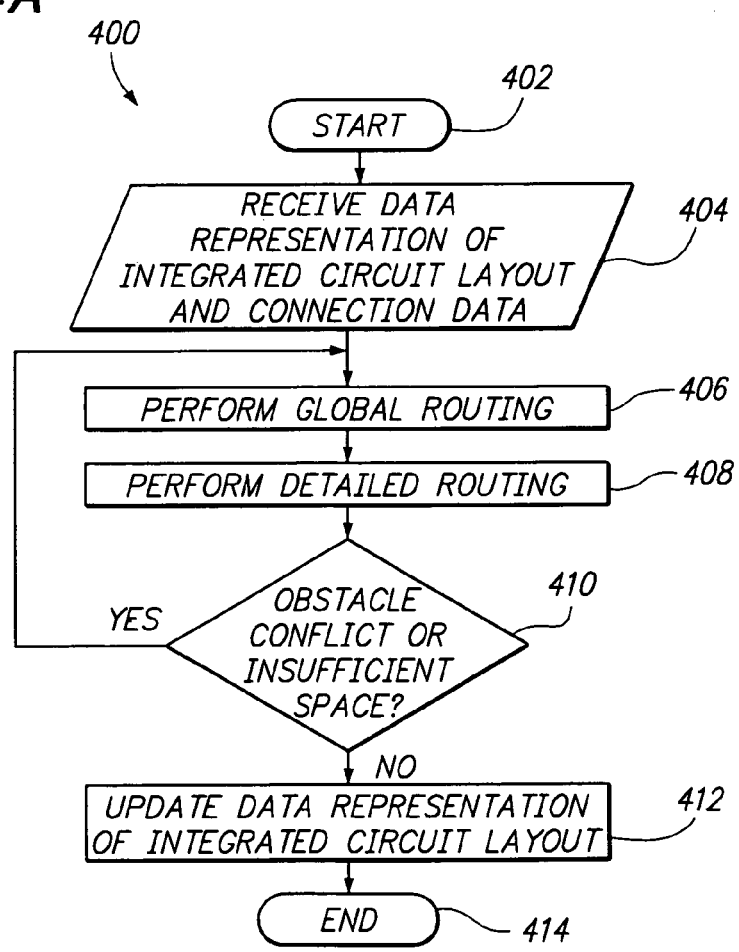
FIG. 4A is a flow diagram illustrating an approach for routing an integrated circuit according to one embodiment of the invention.

The approach for routing an integrated circuit according to one embodiment of the invention is illustrated in a flow diagram 400 of FIG. 4A. After starting in step 402, in step 404, a data representation of an integrated circuit and connection data are received. The data representation specifies the devices and cells contained in the integrated circuit and is usually provided by an integrated circuit synthesis tool. The connection data specifies locations in the integrated circuit that are to be electrically connected.

In step 406, global routing is performed. Global routing, as described in more detail below, involves creating a node graph and join points, changing the layout geometry in preparation for routing and generating a set of one or more initial hint polygons and strategy lists to aid in the placement of the new wires during detailed routing. Global routing also involves performing obstacle resolution when an obstacle conflict or insufficient space prevents the routing of a new wire during detailed routing.

In step 408, detailed routing is performed which generally involves generating and placing new wires between the connection points. In step 410, a determination is made whether a new wire could not be routed because of an obstacle conflict or insufficient space. If the new wire could not be routed for these reasons, then control returns to global routing in step 406, where obstacle resolution is performed to resolve the obstacle conflict and/or provide additional space to route the new wire.

If in step 410, a determination is made that detailed routing was completed without an obstacle conflict or insufficient space problem, then in step 412, the data representation of the integrated circuit is updated to reflect the new wires added to make the specified connections. The process is complete in step 414. The steps in flow diagram 400 provide a high-level understanding of the novel routing approach and do not necessarily reflect all possible scenarios. For example, it is possible that a problem may not be resolvable in global routing in step 406. In this situation, global routing would eventually be halted and the problem identified so that a designer could fix the problem manually. As another example, some designers prefer to fix a relatively small number of unrouted wires manually rather than wait a very long time for automatic routing to be completed. In these situations, it is possible that a user-selectable threshold be employed to allow a user to specify when automatic routing should be halted.

3. Applicable Principles

Several principles are applicable to the approach for routing an integrated circuit described herein. An understanding of these principles will provide a better understanding of global routing and detailed routing. These principles include join points, routing reference points and corner clipping which are each described in more detail hereinafter.

a. Join Points

As is typical in standard industry practice, each node (net) to be routed in the integrated circuit is represented by a bipartite graph, in which nodes representing connections (pins or Steiner Points) are joined by an arbitrary number of edges. The connections are referred to herein as "join points."

According to one embodiment of the invention, each join point is implemented using object-oriented technology, meaning it has a procedural interface common to all join point types. Each join point is thus responsible for creating design rule correct geometry that meets all applicable width, self-spacing, and enclosure rules. This allows local join point-specific design rule checks to be employed which provides considerable flexibility and performance advantages over conventional routing approaches that employ a general design rule check for all integrated circuit layout geometry. Specifically, there are situations where it is desirable to implement join point-specific design rules. For example, there might be a limit placed on the number of routing layers that may be connected in a single "stacked" contact structure. Also, the design rules for a particular join point may change over time based upon the state of attached routing. For example, certain design rules might require that a connection from a first layer of metal to a third layer of metal (and thus containing two "stacked" contacts, one on top of the other) use an extra-large metal enclosure on the second layer of metal, often referred to as a landing pad, unless an external wire is attached to it. These types of design rules are commonly referred to as "landing zone" rules.

Figure 4B:
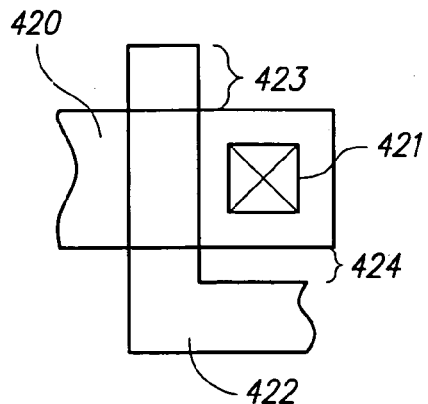
FIGS. 4B-4D are block diagrams illustrating example spacing and extension design rules applicable to gates.
Figure 4C:
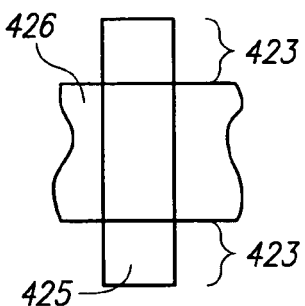
Figure 4D:
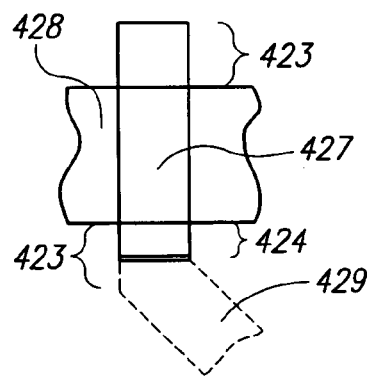

As another example, the open ends of a transistor gate are defined to extend far enough past the diffusion layer that the extension design rule is met. When a wire is to be added, however, the end may be shortened to allow the wire to bend sooner. Once the wire is attached, the extension rule (as well as any spacing requirement between diffusion and non-gate polysilicon) will be met even if the wire is bent immediately after leaving the join point. FIG. 4B illustrates example spacing and extension design rules applicable to gates. Diffusion region 420 includes a contact 421. Polysilicon gate 422 extends beyond diffusion region 420 by gate extension amount 423, e.g., two lambda, to satisfy the gate extension rule. Polysilicon gate 422 is spaced apart from diffusion region 420 by spacing amount 424 to satisfy the polysilicon-to-diffusion spacing rule. In FIG. 4C, polysilicon gate 425 extends beyond diffusion region 426 by gate extension amount 423 on both ends. In FIG. 4D, polysilicon gate 427 extends beyond diffusion region 428 on the unconnected end by gate extension amount 423. Ordinarily, polysilicon gate 427 would not satisfy the gate extension rule since polysilicon gate 427 does not extend beyond diffusion region 428 on the bottom by gate extension amount 423. However, since polysilicon gate 427 is connected to a wire 429, both the gate extension rule and the polysilicon-to-diffusion spacing rules are satisfied by gate extension amount 423 and spacing amount 424, respectively.

Although a general-purpose design rule check can detect these problems without special handling, it can require relatively more analysis time. Implementing design rule checks at the join point level is more efficient and allows a general design rule check to exclude these checks within the join point. Join points are described in more detail hereinafter in the context of types of join points and attributes of join points.

i. Types of Join Points

According to one embodiment of the invention, six types of join points are used. These include single contacts, a line of contacts, an array of contacts, a transistor gate, an external port rectangle (possibly with one or more contacts underneath) and single-layer branches. Examples of each of these six types of join points are illustrated in FIGS. 4E-4J.

Figure 4E:
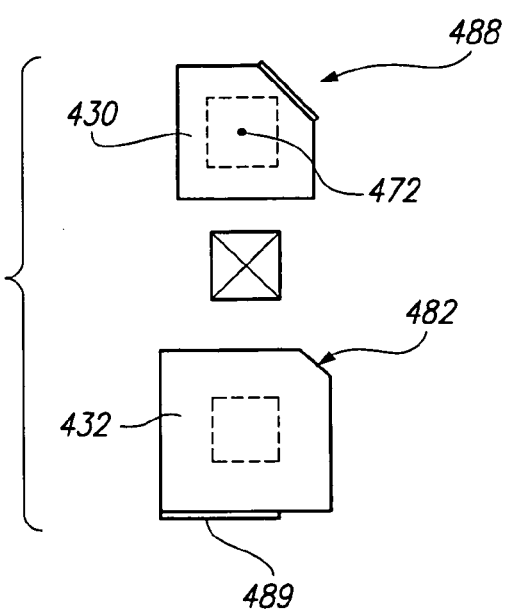
FIG. 4E is a block diagram illustrating the individual layers of a single contact join point according to an embodiment of the invention.

FIG. 4E illustrates the individual layers of a single contact join point that includes single contact join point 430 on an upper routing layer such as a metal layer and a single contact join point 432 on a lower routing layer such as polysilicon.

Figure 4F:
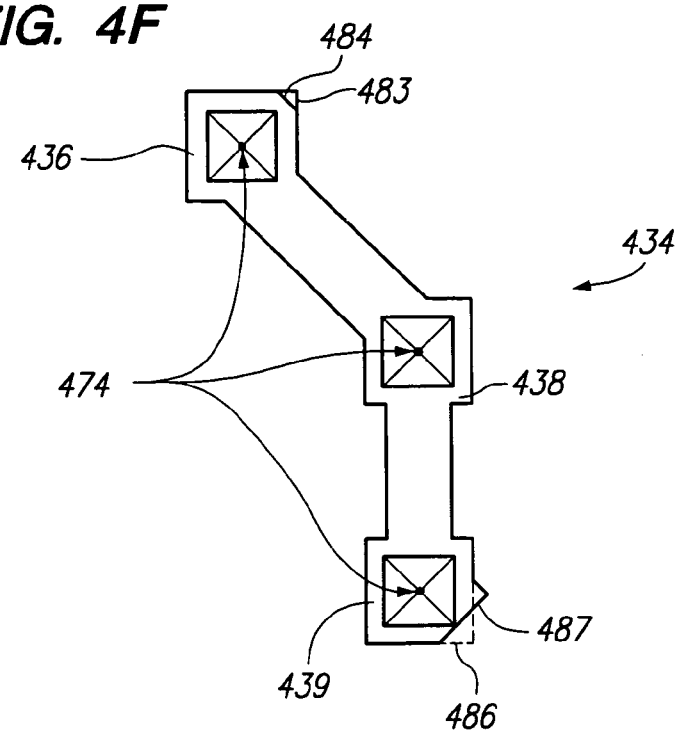
FIG. 4F is a block diagram illustrating a line of contacts join point according to an embodiment of the invention.

FIG. 4F illustrates an example line of contacts join point 434 that includes three contacts, identified by reference numerals 436, 438 and 439.

Figure 4G:
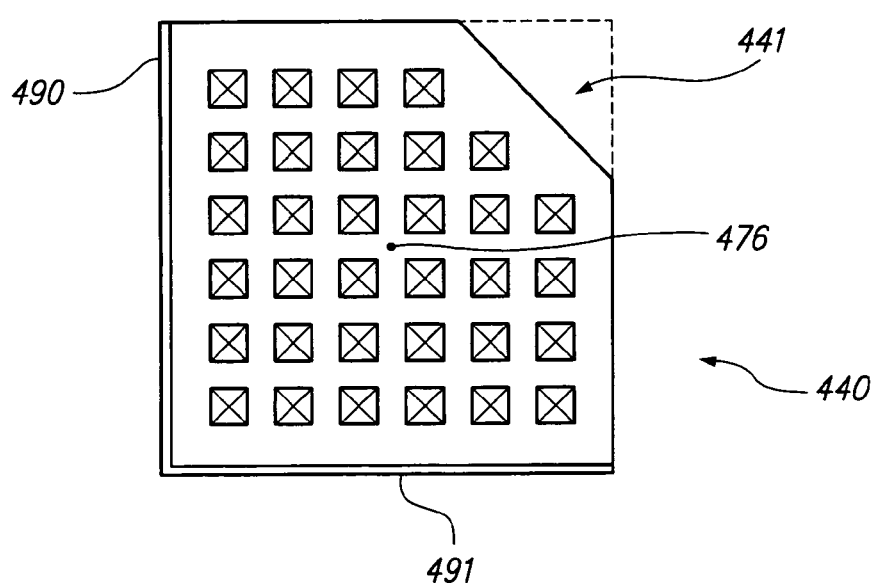
FIG. 4G is a block diagram illustrating an array of contacts join point according to an embodiment of the invention.

FIG. 4G illustrates an example array of contacts join point 440. In this example, array of contacts join point 440 is truncated as opposed to being filled, as illustrated by reference numeral 441.

Figure 4H:
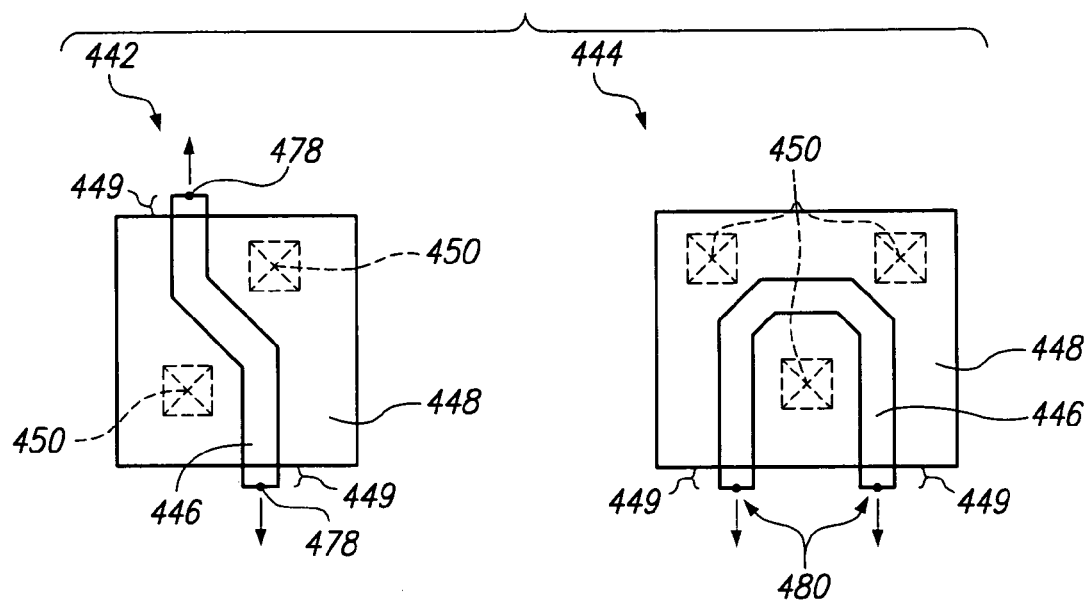
FIG. 4H is a block diagram illustrating two transistor gate join points according to an embodiment of the invention.

FIG. 4H illustrates two examples of transistor gate join points, generally indicated by reference numerals 442 and 444. Transistor gate join points 442, 444 each include a polysilicon region 446 (gate) that overlaps a diffusion region 448 that is not part of transistor gate join points 442, 444. Polysilicon region 446 (gate) includes gate extension portions 449 where the polysilicon region 446 extends beyond the diffusion region 448. Diffusion region 448 is shown for illustration purposes only. Similarly, for purposes of illustration only, contacts 450 are also provided that are also not part of transistor gate join points 442, 444.

Figure 4I:
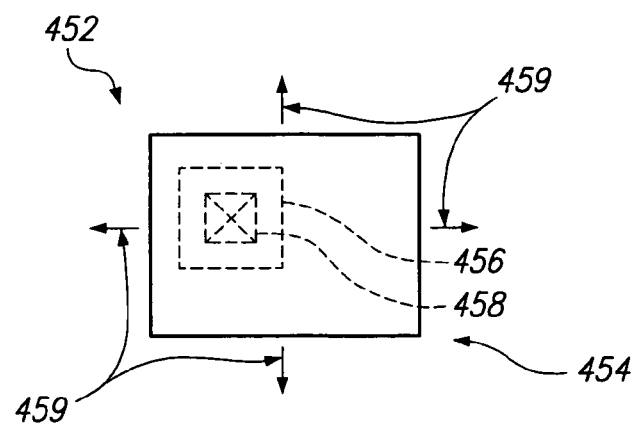
FIG. 4I is a block diagram illustrating an external port rectangle join point according to an embodiment of the invention.

FIG. 4I illustrates an example external port rectangle join point 452 that includes an upper routing layer 454, a lower routing layer 456 and a contact layer 458. For compatibility with conventional routers, only the four orthogonal attachment directions 459 are allowed on the top layer. For intracell routing, these attachment directions are generally not used and are reserved for the intercell router.

Figure 4J:
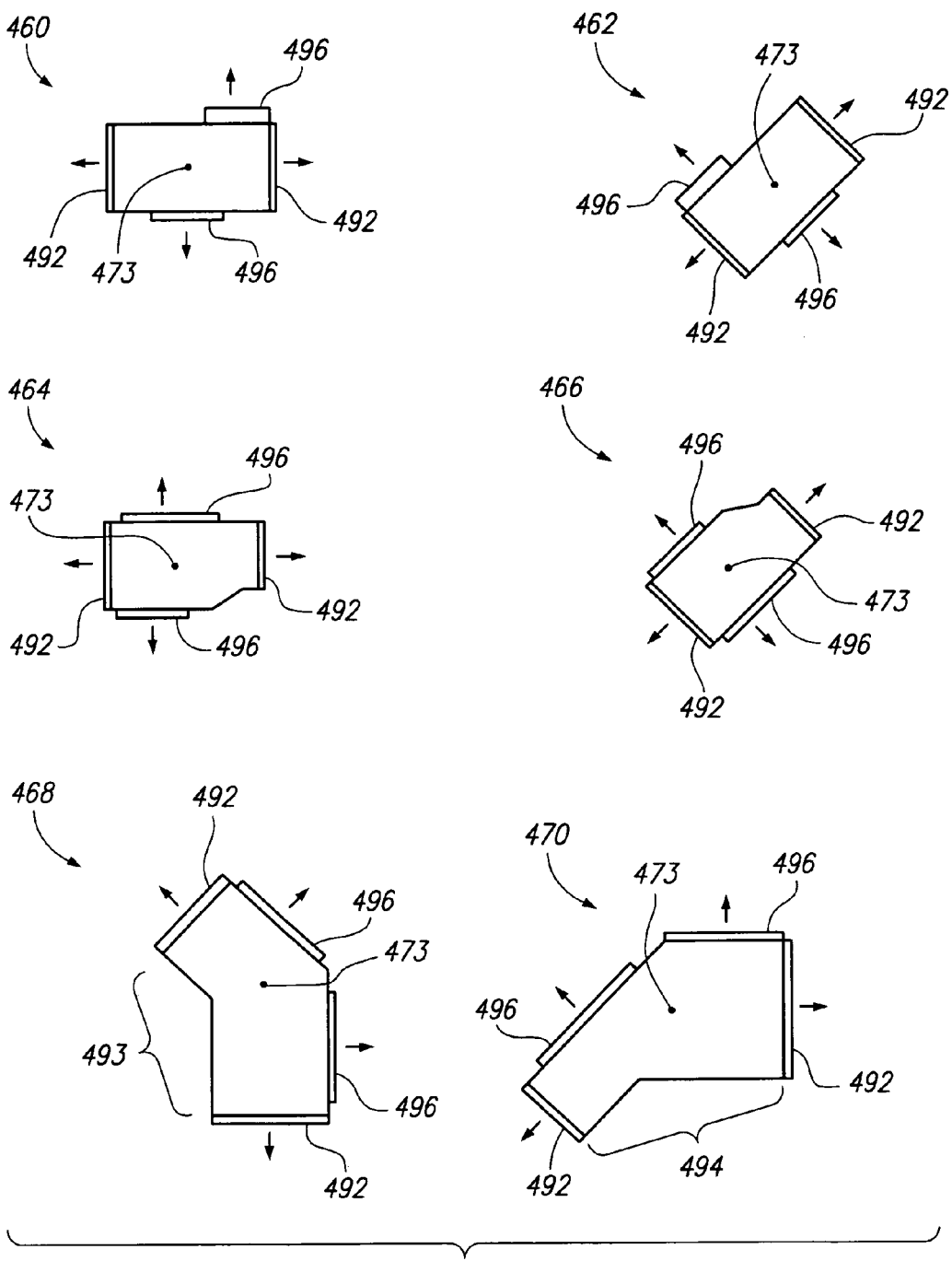
FIG. 4J is a block diagram illustrating single-layer branch join points according to an embodiment of the invention.

FIG. 4J illustrates example single-layer branch join points 460, 462, 464, 466, 468 and 470.

ii. Attributes of Join Points

Each join point has an associated number of attributes. According to one embodiment of the invention, each join point has an upper routing layer index, a lower routing layer index, a join type, a list of router reference points, and a set of layer descriptors. Each layer within the join point, e.g., a routing layer or a contact layer, has a polygon representing the geometry for that layer. Additionally, routing layers have a list of corners clipped (four, one for each diagonal direction), a list of attached wires (typically eight, one for each direction, though they can be indexed by some number and stored with a wire direction) and wire width, edge length, and routing length fields. A join point on a single layer, e.g., a transistor gate join point, has identical upper and lower routing indices and does not have a contact layer. Except for gate and branch join points, additional routing layers can be added or removed at any time, though doing so may cause other changes to the routing polygons such as an increase in contact enclosure. Thus, a change must successfully satisfy a design rule check against the surrounding geometry before being accepted.

Small join points, such as single contacts and small port connections, cannot use all eight routing directions because acute angles would result. Transistor gate and branch join points have restricted attachment directions since routing may attach only to the ends of a gate and a branch is defined by the planning phase of the detailed router to provide a specific connection orientation. A wire may not be attached unless it has a valid orientation and the attachment does not create acute angles in the routing polygon. According to one embodiment of the invention, only a single attached wire is allowed for each orientation and a list of allowable attachment directions is maintained. Furthermore, restricted join points such as transistor gates have their list initialized to include only valid directions. The invention is not limited to this particular embodiment as other approaches are also possible. For example, a design rule check may be performed to compare a proposed wire to the surrounding geometry.

The wire width and edge length fields aid external design rule checking of join points by allowing a determination to be made whether "dogbone" or wide metal spacing rules apply. As is well understood in the art, a dogbone spacing is a waiver from a normal spacing rule, such that the length of the polygon edges in violation is less than a specified amount, e.g., the length of one side of a single contact enclosure. Wide metal spacing design rules may require additional space around wires that exceed a specified width, attributable to nonlinearities in wafer processing.

In some situations, it is desirable to limit how much routing for a node is assigned to high-resistance routing layers such as polysilicon. The routing length field of the join point aids the global router in determining how much routing for a given node is on each routing layer. Destination nodes carry no current, i.e., they drive only polysilicon gates, and so can use high-resistance routing layers relatively freely. Minor nodes carry current only within a single cell or between cells very close together. As a result, high-resistance routing layers may be used for short distances with minor nodes. Major nodes carry current for significant distances across the chip and therefore may not use high-resistance routing layers except to connect to gates within a cell. For power nodes the connecting wires are typically very wide (often predefined within a layout synthesis system), layer changes are minimized and large arrays of contacts are used to connect between routing layers. According to one embodiment of the invention, each node has a type attribute of destination, minor, major, or power that specifies how much routing may be assigned to high-resistance routing layers.

b. Routing Reference Points

One of the tasks of a router is to determine exactly where to connect a new wire to a join point. According to one embodiment, routing reference points are provided with join points to aid routing. The global router chooses which reference point that a wire is directed towards, and the detailed router determines where the wire is connected based on design rules, legal connection directions, and external geometry which may interfere. Referring to FIG. 4E, single contact join point 430 includes a single, centrally positioned routing reference point 472. Similarly, in FIG. 4J, single layer branch join points 460, 462, 464, 466, 468 and 470 each include a routing reference point 473. Referring to FIG. 4F, line of contacts join point 434 includes routing reference points 474 in the center of contacts 436, 438 and 439. Array contacts are generally used to connect large power wires together and therefore are provided with a single routing reference point. For example, referring to FIG. 4G, array of contacts join point 440 includes a routing reference point 476.

Routing join points are particularly helpful when a join point has a nontrivial span. For example, referring to FIG. 4H, transistor gate join points 442 and 444 are provided with routing reference points 478 and 480, respectively, at both ends of polysilicon region 446 since a wire can be connected to a transistor gate at either end or both ends. In this situation, polysilicon gate 446 is available as a "free" routing resource.

c. Corner Clipping

Figure 5A:
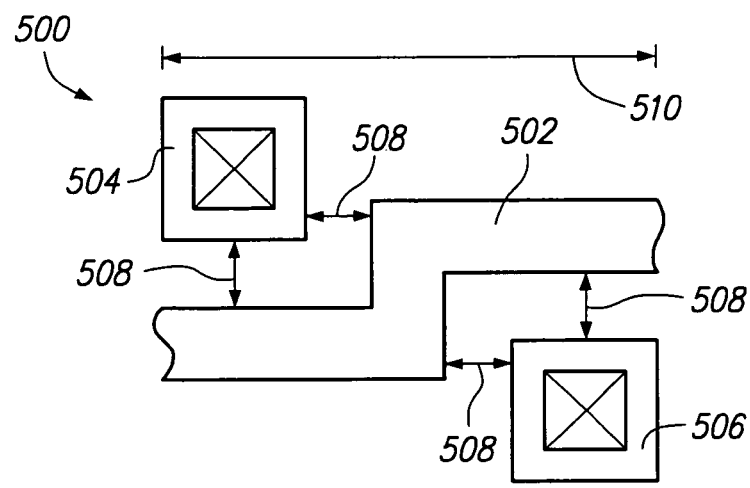
FIG. 5A is a block diagram illustrating routing a wire between two contacts without corner clipping.
Figure 5B:
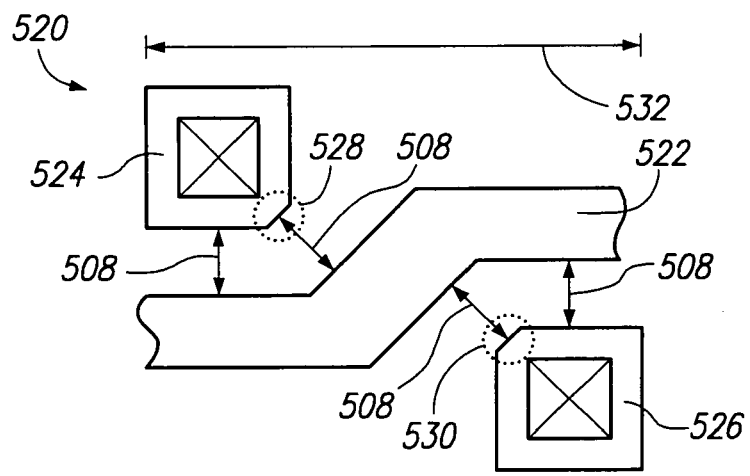
FIG. 5B is a block diagram illustrating routing a wire between two contacts using corner clipping according to an embodiment of the invention.

Corner clipping is an approach for changing the geometry of an integrated circuit layout to allow a wire to approach more closely to the geometry, thereby providing a smaller layout. Corner clipping involves removing geometry from a square corner such that a forty-five degree angle is created. FIGS. 5A and 5B illustrate the use and advantages of corner clipping. FIG. 5A is a block diagram 500 that illustrates routing a wire between two contacts without corner clipping. Specifically, a wire 502 routed between two contacts 504 and 506 must contain an orthogonal jog to get through contacts 504 and 506 while satisfying the minimum spacing requirement indicated by reference numeral 508. In this example of routing without corner clipping, the size of the layout, as measured from the left edge of contact 504 to the right edge of contact 506, is indicated by reference numeral 510.

FIG. 5B is a block diagram 520 that illustrates routing a wire between two contacts using corner clipping. Specifically, a wire 522 is routed between two contacts 524 and 526. Contacts 524 and 526 each have a clipped corner, as indicated by reference numerals 528 and 530, respectively. Wire 522 is routed through contacts 524 and 526 using a non-orthogonal jog while still satisfying minimum spacing requirement 508. This allows contacts 524 and 526 to be placed closer together (horizontally), providing a smaller layout. Specifically, the size of the layout, as measured from the left edge of contact 524 to the right edge of contact 526, as indicated by reference numeral 532, is smaller than size 510 in FIG. 5A. Thus, corner clipping contacts 524 and 526 allows the layout to be smaller in size horizontally, increasing circuit density.

One disadvantage of corner clipping is that the technique increases the mask feature count, which makes mask inspection more difficult and may reduce circuit yield when contacts do not properly align with routing layers. Therefore, according to one embodiment, corner clipping is only used when it results in an increase in circuit density.

In the example of FIG. 5B, the corner clipping regions 528 and 530 remove approximately one grid unit of contacts 524 and 526, respectively. However, on some routing layers more than one grid unit can be cut off. Therefore, according to one embodiment, a clipping amount is stored for each corner of each routing layer to indicate the clipped amount, if any.

Other examples of corner clipping include in FIG. 4E, a clipped corner 482 of single contact join point 432 and in FIG. 4F, unclipped corner 483 and clipped corner 484, on a lower routing layer and upper routing layer, respectively.

Corner clipping is not applicable for all types of layout geometry. Specifically, transistor gates, ports, and branch structures may not have corners clipped. As discussed herein, transistor gates require a minimum extension of the polysilicon gate past the edge of the diffusion polygon. The upper layer of each port is typically defined by a user and must meet requirements of conventional inter-cell routers, although corners on lower routing layers (if they are added later) may be clipped. Finally, branch structures are defined to be either straight or bent at a forty five degree angle only.

According to one embodiment of the invention, the polygon for a routing layer is modified whenever a corner of a routing layer is clipped or a wire is added to the routing layer. This change is made independent of any changes made to the wiring between join points. Maintaining a single non-overlapping polygon for each routing layer can reduce the complexity of design rule checks since join points do not have to exclude design rule checks to their own polygons. If a layer is added or removed, the polygons for the other layers may also need to be modified, depending on the design rules. The invention is not limited to single polygon routing layers. Routing layers for join points may be built from multiple polygons.

4. Global Routing

Global routing generally involves evaluating the integrated circuit layout to be routed to identify problem areas that can be besting handled during global routing using the high level knowledge of the integrated circuit layout available to global routing to generate an effective evasion strategy. For example, the knowledge of diffusion island placement available to global routing allows adjustments to be made prior to detail routing. This approach promotes algorithmic simplicity and execution speed by relieving the detailed router of making layer changes or routing around objects. The result is that many wires can be routed without intervention.

According to one embodiment of the invention, global routing directs the routing of new wires towards the routing reference points on join points as previously described herein. However, the wires may be moved during detailed routing so long as no spacing violations result. Examples of valid wire moves are described in more detail hereinafter in the detailed routing section.

To accomplish these objectives, according to one embodiment of the invention, global routing involves generating strategy lists and generating hint polygons. Strategy lists and hint polygons are applicable to new wires being routed between any type of join points and are described in more detail hereinafter.

a. Strategy Lists

Strategy lists help guide the routing of new wires during detailed routing. According to one embodiment of the invention, a strategy list is generated for each new wire and specifies a bias direction, a straying limit and a simple routing indicator (flag). Each of these attributes of strategy lists are described in more detail hereinafter.

i. Bias Direction

Figure 6A:
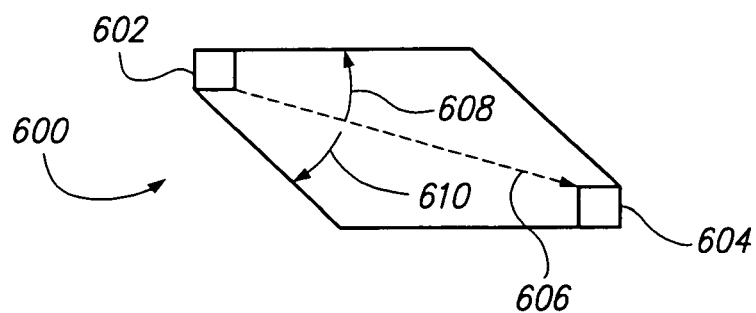
FIG. 6A is a block diagram illustrating the use of a bias direction to route a new wire from a starting join point to an ending join point according to an embodiment of the invention.

A bias direction is used to specify a general direction that a wire should follow during detailed routing to reach a specified ending join point from a specified starting join point. According to one embodiment of the invention, the bias direction specifies that a wire should be routed either left or right, as viewed from the starting join point to the ending join point. FIG. 6A is a block diagram 600 that illustrates the use of a bias direction to route a new wire from a starting join point to an ending join point according to an embodiment of the invention. Suppose a new wire is to be routed from a starting join point 602 to an ending join point 604. Line 606 represents a generally straight sighting from starting join point 602 to ending join point 604. A left bias indicates that the new wire from starting join point 602 to ending join point 604 should generally be routed as far to the left of line 606 as possible, as indicated by line 608. A right bias indicates that the new wire from starting join point 602 to ending join point 604 should generally be routed as far to the right of line 606 as possible, as indicated by line 610.

ii. Straying Limit

A straying limit is used to define a region within which a new wire may be routed to connect a starting join point to and ending join point during detailed routing. Thus, a straying limit restrains the detailed routing in the event that obstacles are encountered along a preferred path and an alternative path is attempted to route around the obstacle.

Figure 6B:
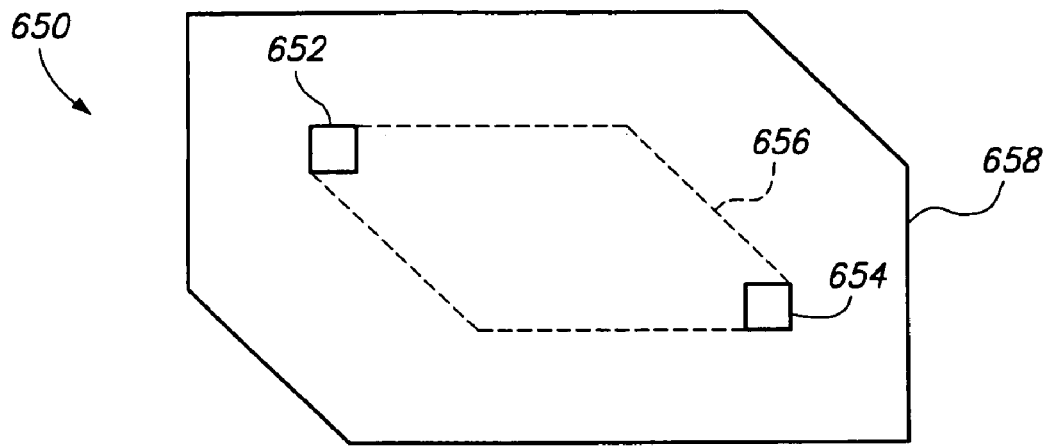
FIG. 6B is a block diagram illustrating the use of a straying limit to control the routing of a new wire from a starting join point to an ending join point according to an embodiment of the invention.

FIG. 6B is a block diagram 650 that illustrates the use of a straying limit to control the routing of a new wire from a starting join point 652 to an ending join point 654 according to an embodiment of the invention. Routing region 656 is an octant routing region (for non-orthogonal geometry) defined between starting join point 652 and ending join point 654. Routing region 658 is defined by routing region 656 and a specified straying limit. According to one embodiment of the invention, the specified straying limit is a Manhattan distance (if non-orthogonal, one unit over and one unit up for each unit of distance) outside of the octant routing region defined between the starting and ending join points. Accordingly, in the present example, routing region 658 is defined by a specified straying limit (Manhattan distance) from routing region 656. Thus, the routing of a new wire to connect starting join point 652 and ending join point 654 cannot extend beyond routing region 658 that is defined by the specified straying limit.

iii. Simple Routing Indicator

It is not uncommon for changes to be required to layout geometry to successfully route a new wire, typically by making enough room to route the new wire. However, these changes can cause adverse effects on the resulting integrated circuit. For example, clipping the corner of a contact enclosure makes the contact enclosure more sensitive to misalignment and may reduce fabrication yield. Similarly, clipping the corner of a transistor island or adjusting a source/drain contact increases source/drain resistance and thus slows the integrated circuit.

Therefore, according to one embodiment of the invention, a simple routing indicator is used generally to control whether changes are made to surrounding geometry during detailed routing of a new wire. According to one embodiment of the invention, a simple routing indicator is created and asserted (by default) for each new wire during global routing to disable layout changes during detailed routing. If, during global routing, existing wires in a particular area need to be moved to allow the routing of a new wire, the simple routing flag is cleared for each routing stretch of the affected wires and the nearby portions are rerouted. A routing stretch is defined herein as a portion of a routing wire between two join points, between a join point and a hint polygon (described hereinafter), or between two hint polygons. During detailed routing, the simple routing indicator is examined to determine whether it is set. If so, then during detailed routing, new wires are routed around obstacles, instead of allowing obstacles or surrounding geometry to be modified. Thus, a determination is made during global routing whether layout changes are allowed during detailed routing.

b. Hint Polygons

The approach for routing an integrated circuit described herein includes the use of routing indicators, referred to herein for convenience as "hint polygons," to aid in the placement of new wires during detailed routing. According to one embodiment of the invention, hint polygons are generated to identify locations in the integrated circuit layout where detailed routing is likely to be particularly difficult. For example, hint polygons may be used to identify a tight spot between contacts where it is not obvious that room exists to route a new wire, e.g., if enclosure corners must be clipped to make room. As another example, hint polygons may be used to identify the end of an obstacle to reduce the amount of searching required during detailed routing to find the end of an obstacle. According to another embodiment of the invention, hint polygons are used to simplify the detailed routing algorithm. For example, hint polygons may be used to avoid the need for U-turns during detailed routing if a join point such as a transistor gate has restricted attachment directions. As another example, hint polygons may be used to "reserve" locations for new wires to be routed at a later time. According to one embodiment of the invention, each hint polygon has a direction attribute so that the hint polygons can be approached from the proper end during detailed routing.

It is worth noting that some conventional routers, e.g., the interactive maze router in the MAGIC layout tool, use "fences" to prevent the router from using undesirable regions of the layout. The use of two parallel fences can guide the router through a tight spot if the router has already chosen to approach it, but as these have a finite size they may interfere with routing of later wires. Additionally, fences do not force wires to go through them but only constrain the detailed router should it choose to use the layout region near the fences. Thus fences are a negative constraint and hint polygons are a positive constraint.

Figure 7:
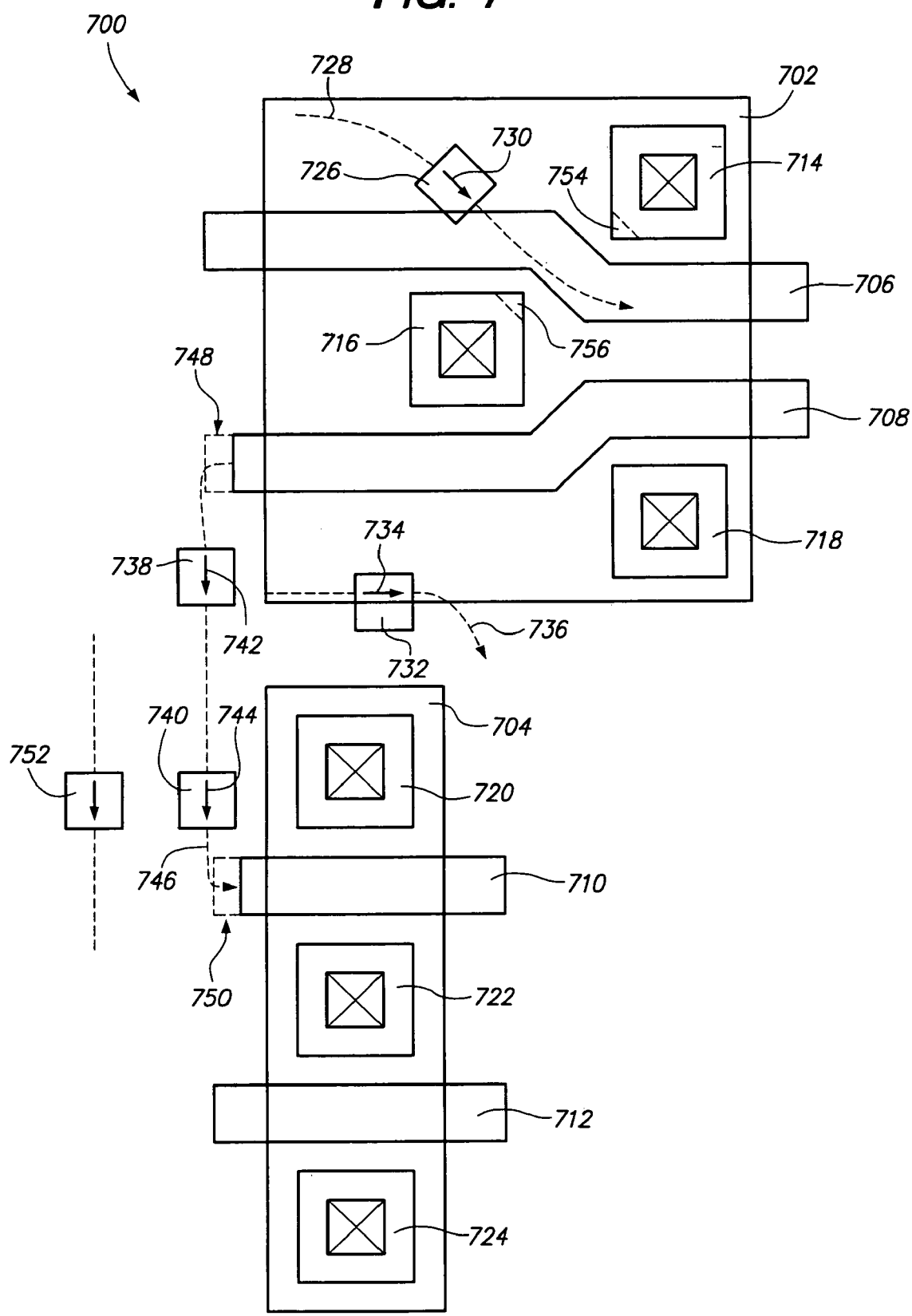
FIG. 7 is a block diagram of a portion of an integrated circuit that illustrates using hint polygons during routing of an integrated circuit according to an embodiment.

FIG. 7 is a block diagram of a portion of an integrated circuit 700 that illustrates the various embodiments just described for using hint polygons during routing of an integrated circuit. Integrated circuit 700 includes diffusion regions 702 and 704. Integrated circuit 700 also includes polysilicon regions 706 and 708 on diffusion region 702 and polysilicon regions 710 and 712 on diffusion region 704. Diffusion region 702 includes contacts 714, 716 and 718. Diffusion region 704 includes contacts 720, 722 and 724.

A hint polygon 726 is generated and included in integrated circuit 700 to aid in the routing of a metal wire between contacts 714 and 716 along a path defined by dashed line 728. Hint polygon 726 includes a direction indicator 730, visually represented as an arrow, that indicates the generally preferred direction that a metal wire should approach to fit between contacts 714 and 716.

A hint polygon 732 is generated and included in integrated circuit 700 to aid in the routing of a metal wire around diffusion island 704 and contact 720. Specifically, hint polygon 732 indicates the end of the obstacle defined by contact 720 and thereby the point at which a metal wire can be bent around contact 720, in the direction indicated by direction indicator 734 and arrow 736. Hint polygon 732 limits the amount of searching for the end of contact 720 that must be performed during detailed routing, thereby simplifying detailed routing.

Hint polygons 738 and 740 are U-turn avoidance type hint polygons that are generated and included in integrated circuit 700 to aid in connecting polysilicon region 708 to polysilicon region 710. Hint polygons 738 and 740 are particularly useful in this situation since as transistor gates, polysilicon regions 708 and 710, have restricted attachment directions. Specifically, the new polysilicon added to integrated circuit 700 must connect straight on to polysilicon regions 708 and 710, orthogonal to diffusion regions 702 and 704. Hint polygons 738 and 740 include direction indicators 742 and 744, respectively, to indicate the preferred routing direction from polysilicon region 708 to polysilicon region 710, as indicated by arrow 746. Note that in this example, ends 748 and 750 of polysilicon regions 708 and 710, respectively, have been shortened when the targets were defined as described herein.

A hint polygon 752 has been generated and included in integrated circuit 700 to reserve a polysilicon routing area.

Hint polygons may also be placed along a suggested path and the feasibility of the suggested path determined during detailed routing. For example, hint polygon 726 placed between contacts 714 and 716 (source/drain contact join points) may cause the clipping of enclosure corners 754 and 756 during detailed routing. Alternatively, hint polygon 726 may cause contacts 714 and 716 to be separated during detailed routing to make room for a metal wire as it is routed.

According to another embodiment of the invention, a design rule check is run on hint polygons as they are generated during global routing to ensure routing feasibility during detailed routing. Because of the small size and generally limited number of hint polygons, this can provide substantial performance benefits over the approach of performing a detailed routing for feasibility tests.

According to one embodiment of the invention, a "short path" indicator is asserted when a routing path between two join points is so short that they would violate spacing rules, i.e., they are very close together or even abutting. This is to accommodate design rule checks of short paths.

5. Detailed Routing

Detailed routing generally involves searching for sets of valid points in the integrated circuit layout upon which to place the new wires to make the specified connections between join points.

Figure 8:
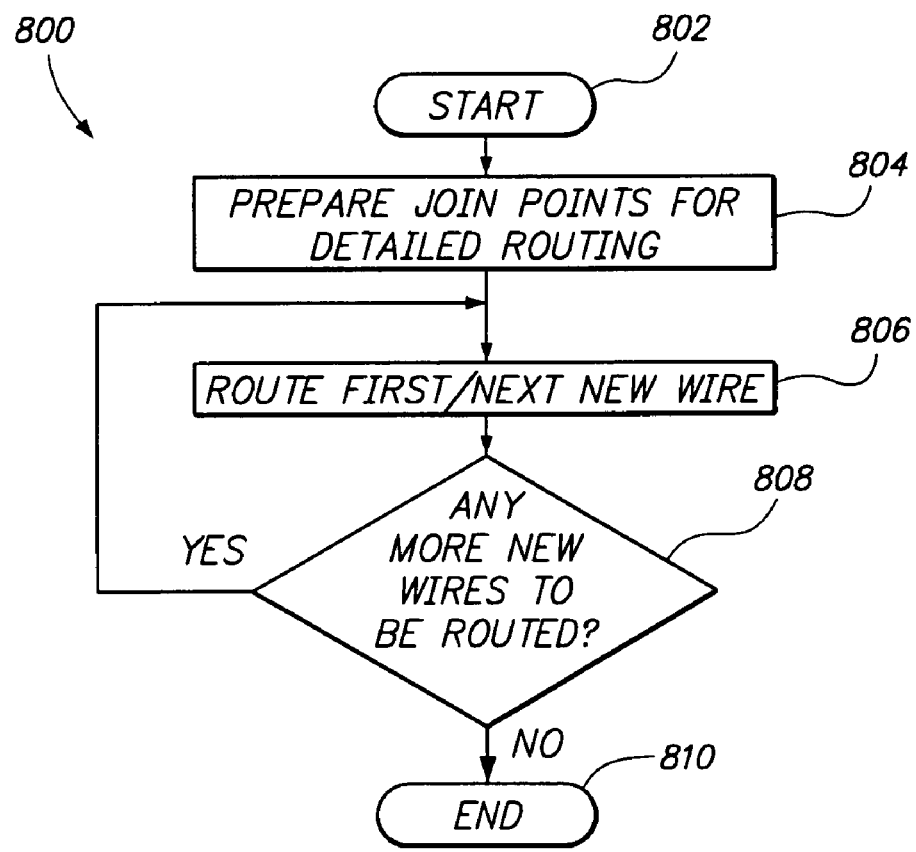
FIG. 8 is a high-level flow diagram illustrating the detailed routing approach for routing new wires in an integrated circuit layout according to an embodiment of the invention.

FIG. 8 is a high-level flow diagram 800 that illustrates the detailed routing approach for routing new wires in an integrated circuit layout according to an embodiment of the invention. Flow diagram 800 provides an overview of the detailed routing process and each of the steps are described in more detail hereinafter. After starting in step 802, in step 804, the join points are prepared for detailed routing. This generally includes adding wire attachments and establishing join point targets to which wires are attached.

In step 806, the first wire is routed. In step 808, a determination is made whether any more wires need to be routed. If so, then in step 806, the next wire is routed. If no more wires need to be routed, or if none of the remaining wires can be routed due to insufficient space, then the process is complete in step 810. If the routing cannot be completed, manual intervention is required, as in conventional routers.

The various aspects of detailed routing according to an embodiment of the invention are now described as follows: adding wire attachments, routing targets, routing a new wire, join point design rule checking, approaching indicators for design rule checking, short path indicators for design rule checking, routing path design rule checking and tight routing situations.

a. Adding Wire Attachments

When a join point is first created, it has no connected wires. Therefore, according to an embodiment of the invention, one of the first steps of detailed routing is to add wire attachments to join points at each end of an edge. In conventional routing approaches that use orthogonal routing and a coarse routing grid, every pin location is a simple rectangle with its center on a grid point. Wire centers are also on this grid, so each pin has a very limited number of possible representations.

As previously described, the approach for routing an integrated circuit according to an embodiment of the invention supports non-orthogonal routing. With non-orthogonal routing, it is sometimes necessary to attach wires to join points in a manner such that the center lines of the wires do not pass through the centers of the join points. This provides many ways to attach a wire to a join point, and thereby many ways to represent the join point polygon, without an implicit attachment location.

Figure 9:
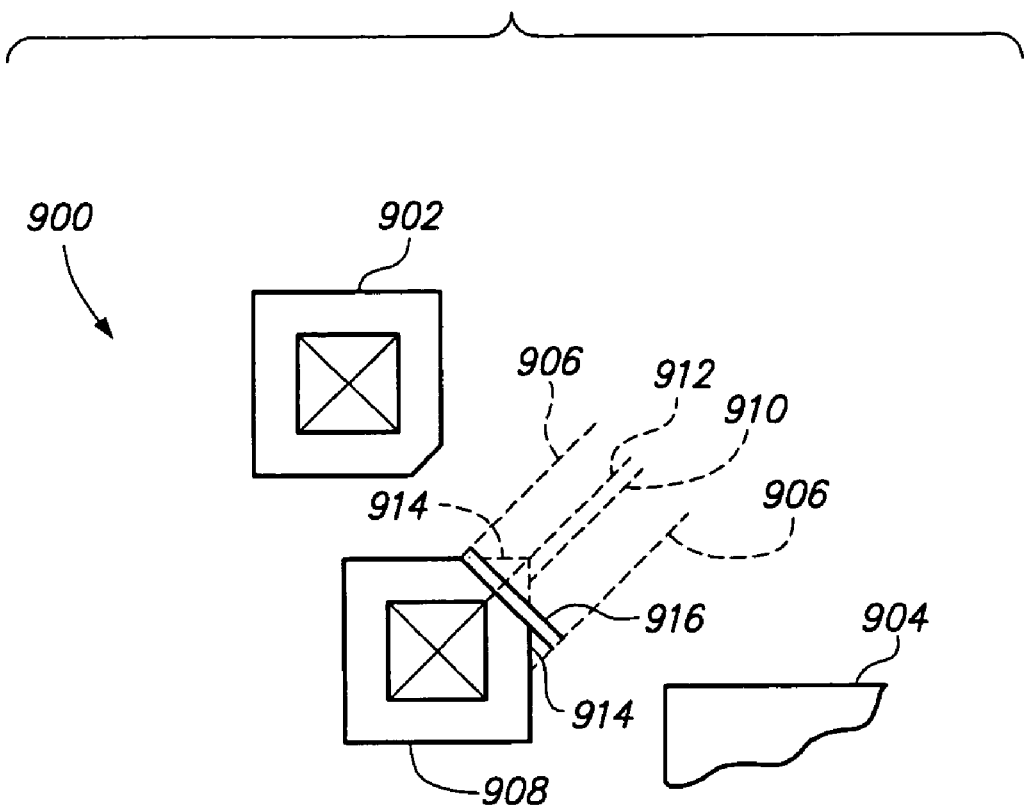
FIG. 9 is a block diagram illustrating adding wire attachments to join points according to an embodiment of the invention.

FIG. 9 is a block diagram 900 that illustrates adding wire attachments to join points according to an embodiment of the invention. Diagram 900 includes a contact 902 and another integrated circuit layout object 904, for which the type is not important for this example. A new wire, the position of which is represented on FIG. 9 by dashed lines 906, is to be attached to a contact 908 at a non-orthogonal angle, i.e., at an angle other than ninety degrees. Accordingly, in this example, the center line 910 of wire 906 is not coincident with the center line 912 of contact 908. To allow wire 906 to be attached to contact 908, the original enclosure of contact 908, represented by a dashed line 914, is modified to include a small piece of wire with a routing target 916 to which the new wire 906 can be readily and legally attached during detailed routing. That is, attaching the new wire 906 to routing target 916 ensures that the applicable design rules will be satisfied. The use of routing targets to aid in detailed routing is discussed in more detail hereinafter.

An example of adding wire attachments to an array of contact join point is illustrated in FIG. 4F. To allow a new wire (not illustrated) to be attached to line of contacts join point 434, the original enclosure of contact 439, represented by a dashed line 486, is modified to include a small piece of wire with a routing target 487, to which the new wire can be readily attached during detailed routing. Attaching the new wire to routing target 487 ensures that applicable design rules are satisfied.

b. Routing Targets

Routing targets are used according to the routing approach described herein to aid the detailed routing of new wires by specifying a design rule valid location and approach direction to route a new wire to a join point. As previously described with reference to FIG. 9, routing target 916 provides a design rule valid connection location for wire 906. According to one embodiment of the invention, routing targets are generated on join points to ensure that wires connected to the routing targets will satisfy applicable design rules. For example, in FIG. 4E, routing targets 488 and 489 are provided on single contact join points 430 and 432, respectively. In FIG. 4G, routing targets 490 and 491 are provided on two sides of array of contact join point 440.

FIG. 4J illustrates various example locations for routing targets on single-layer branch join points 460, 462, 464, 466, 468 and 470. In this example, single-layer branch join points 460, 462, 464, 466, 468 and 470 have routing targets 492 on their ends, where the routing targets are as wide as the body of the join point. Consequently, routing targets 492 have only a single valid site. Single-layer branch join points 460, 462, 464, 466, 468 and 470 also may have routing targets 496 on their sides, which may have smaller or wider wires attached. Routing targets 496 may be located anywhere along the sides of single-layer branch join points 460, 462, 464, 466, 468 and 470 where the design rules are satisfied.

As illustrated on FIG. 4J, each routing target 492 includes a direction indicator that indicates the valid connection direction of the routing targets 492 to a wire. The routing targets guide the detailed routing of a wire to a join point to ensure that the connection satisfies applicable design rules. For example, referring to FIG. 4J, single-layer branch join point 468 includes four routing targets 492 and 496. A wire may be connected to any of these routing targets from the indicated direction and satisfy the applicable design rules. However, single-layer branch join point 468 does not include any routing targets in the region identified by reference numeral 493 since connecting a wire to single-layer branch join point 468 at this location would violate a design rule spacing requirement. Similarly, single-layer branch join point 470 includes a region 494 without routing targets since connecting a wire to single-layer branch join point 470 at this region would also violate a design rule spacing requirement.

c. Routing a New Wire

The routing of a new wire generally involves generating one or more routing stretches, i.e., portions of the new wire, between the starting and ending join point, between the starting join point and a hint polygon, between two hint polygons, or between a hint polygon and the ending join point. Thus, the end of a routing stretch is either a hint polygon (first or next) or the ending join point. The last routing stretch in a wire always terminates at the ending join point.

The placement of new wires in any location in an integrated circuit layout (subject to a small drawing grid for mask making), the use of non-orthogonal geometry and support for advanced design rules such as "dogbone" and wide metal spacing rules all require that design rule checks be performed on the routed geometry as it is constructed. Performing design rule checks during detailed routing provides several important benefits. First, the amount of time required to perform design rule checking is generally reduced, since new wires are constructed to be design rule correct. Second, this aids in resolving obstacle conflicts that cannot be resolved during detailed routing and must be resolved during global routing.

Starting from the starting join point for a new wire, the first routing stretch is extended in a straight line towards the end of the routing stretch until the routing stretch either reaches an edge of the allowed routing region or an obstacle. The routing stretch is then bent appropriately. If the bias direction is such that a direct extension of the routing stretch would cause the routing stretch to follow the wrong side of the routing region, then a bend is added as soon as is feasible. If, during the routing of a routing stretch, an edge of the routing region is reached before an obstacle, then the routing stretch is bent to direct the routing stretch towards the target of the routing stretch, i.e., the next hint polygon or the ending join point. If an obstacle is reached, a decision is made as to which bend directions are feasible. Each bend direction is tested in sequence before detailed routing is stopped. This includes re-bending and extending the routing stretch until the edge of the routing region or another obstacle is reached. Once a determination is made that either there is no apparent way to successfully route a routing stretch around an obstacle or that a U-turn would be required, no matter which bend direction is tried, then detailed routing of the wire stops. The current end point is provided to global routing and a determination is made how to proceed.

It is worth noting that in a conventional maze router, all possible locations are tested, even those off a direct path between the starting and ending points. Thus if there are no obstacles between the starting and ending points, many more locations are examined than is necessary. In the present embodiment, a search off the direct path is initiated only when an obstacle is encountered, and the search is terminated relatively quickly if no obvious path around the obstacle is evident. The global router then provides assistance to the detailed router so that it may evade the obstacle. Thus, the amount of computational resources required to route a wire is significantly reduced.

According to one embodiment of the invention, detailed routing will back up until the original end of the wire is reached, but no further. Further backtracking, if any, must be performed during global routing. For example, the global router may backtrack to the previous bend so that it can be changed, causing the wire to approach the obstacle at a different angle that may make different bend directions possible. Global routing might also insert one or more hint polygons to direct the search of detailed routing around the obstacle.

Figure 10A:
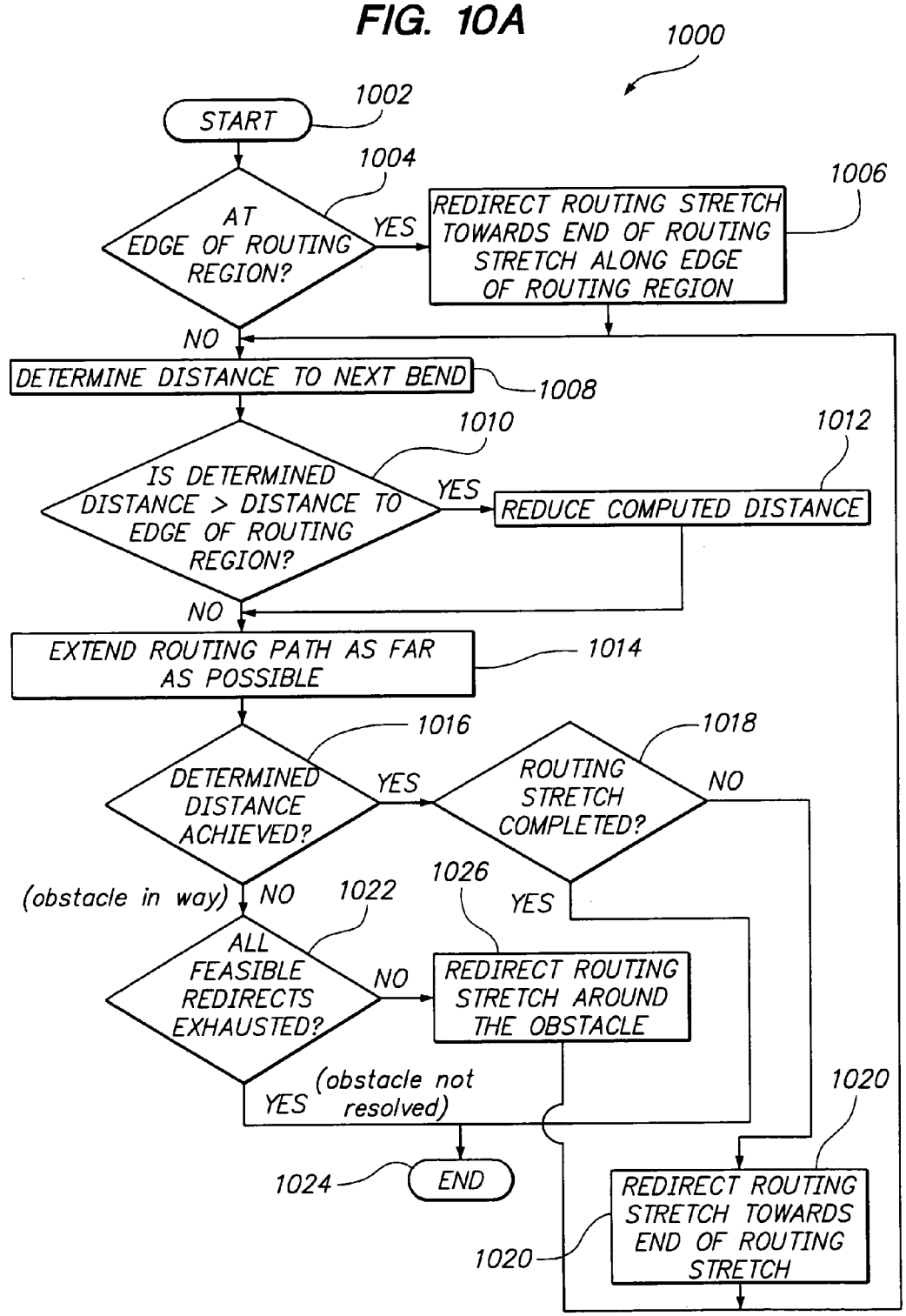
FIG. 10A is a flow diagram illustrating an approach for generating a routing stretch according to an embodiment of the invention.
Figure 10B:
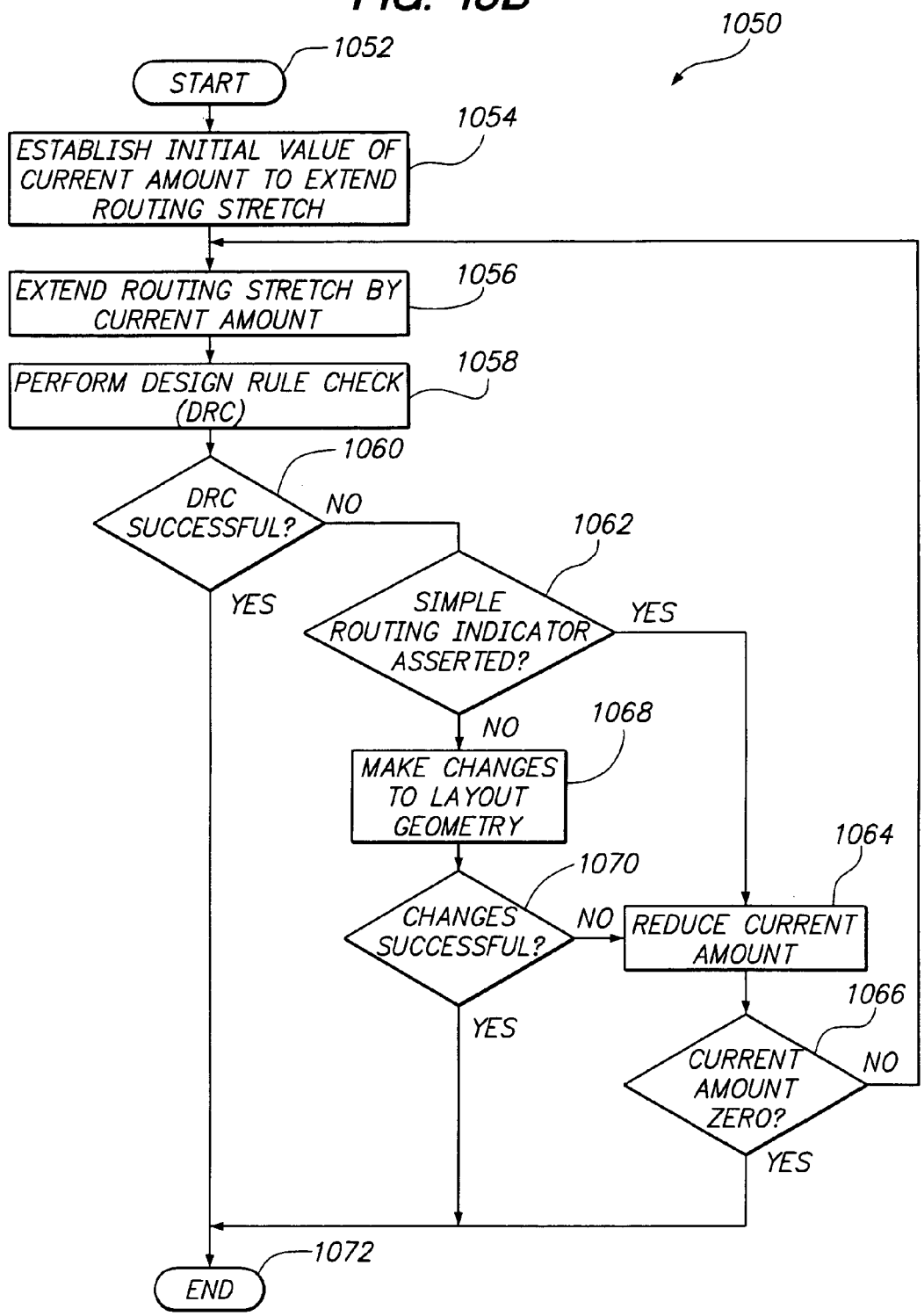
FIG. 10B is a flow diagram illustrating an approach for extending a routing stretch according to an embodiment of the invention.

FIGS. 10A and 10B are flow diagrams 1000 and 1500, respectively, that illustrate an approach for generating a routing stretch according to an embodiment of the invention. Referring first to FIG. 10A, after starting in step 1002, in step 1004, a determination is made whether the routing stretch is at the edge of the routing region. If so, then in step 1006, the routing stretch is redirected towards the end of the routing stretch along the edge of the routing region.

In step 1008, the distance to the next bend is determined. In step 1010, a determination is made whether the determined distance is greater than the distance to the edge of the routing region. If so, then in step 1012, the determined distance is reduced to keep the routing stretch within the routing region.

In step 1014, the routing path is extended as far as possible, as described in more detail hereinafter with reference to FIG. 10B.

In step 1016, a determination is made whether the determined distance was achieved. If the determined distance was achieved, then in step 1018, a determination is made whether the routing stretch has been completed. If the routing stretch was not completed, then in step 1020, the routing stretch is redirected toward the end of the routing stretch. Control then returns to step 1008 where the distance to the next bend is determined.

If in step 1016 the determined distance has not been achieved, then there is an obstacle in the way and in step 1022, a determination is made whether all feasible redirects have been exhausted. If all feasible redirects have not been exhausted, then control proceeds to step 1026, where the routing stretch is redirected around the obstacle. Control then returns to step 1008 where the distance to the next bend is determined.

A redirect is invalid if the redirect aims the routing path one hundred eighty (180) degrees away from the end of the routing stretch, i.e., requires a U-turn afterward, or if the end of the routing path is outside the routing region after making the specified redirect.

If, in step 1022, all feasible redirects have been exhausted, then the obstacle conflict cannot be resolved and the process is complete in step 1024. In this situation, obstacle resolution is performed in global routing to attempt to resolve the obstacle conflict.

If, in step 1018, the routing stretch is completed, then the process is complete in step 1024.

Referring to FIG. 10B, a flow diagram 1050 illustrates an approach for extending a routing stretch according to an embodiment of the invention. After starting in step 1052, in step 1054, an initial value of the current amount to extend the routing stretch is established. For example, the current amount may be set to a specified value. In step 1056, the routing stretch is extended by the current amount.

In step 1058, a design rule check is performed on the extended routing stretch to determine whether the applicable design rules are satisfied. In step 1060, a determination is made whether the design rule check was successful. If the design rule check was not successful, then in step 1062, a determination is made whether the simple routing indicator is asserted for the routing path. If the simple routing indicator is asserted, then no changes can be made to the surrounding layout geometry and control proceeds to step 1064 where the current amount is reduced by a specified amount. Then, in step 1066, a determination is made whether the current amount is zero. If the current amount is not zero, then control returns to step 1056, where the routing stretch is extended again, this time by the reduced current amount established in step 1064.

If in step 1062, the simple routing indicator is not asserted, then in step 1068, changes are made to the surrounding layout geometry in an attempt to resolve the design rule check error. For example, as described herein, corner clipping may be employed or a source/drain contact moved to provide additional room for the routing stretch.

In step 1070, a determination is made whether the changes were successful. If the changes were not successful, then the current amount is reduced by the specified amount in step 1064. Then, the determination is made in step 1066 whether the current amount is zero. If the current amount is not zero, then control returns to step 1056 where the routing stretch is extended by a lesser amount.

If in step 1060 the design rule check is successful, or in step 1070 the changes made to the surrounding geometry successfully resolved the design rule check error, or in step 1066 the current amount is zero, then the process is complete in step 1072. Note that in the situation where the process is completed because the current amount is zero, via step 1066, then the routing stretch could not be extended within the applicable design rules and redirection or global routing is used to try to resolve the conflict. If the current amount returned is less than the initial value, step 1016 of FIG. 10A will note that the determined distance was not achieved, and step 1022 will be executed. If another feasible redirect is possible, the final design rule check error is used in step 1026 to determine the obstacle avoidance direction.

According to one embodiment of the invention, the routing of a new wire is performed in the context of generating a "routing path." As defined herein, a routing path implements a connection between two join points as a wire on a single layer with no width changes. If a determination is made during global routing that the width of a wire is to be changed, then a branch join point is inserted with no side connections to allow the incoming wire to have a different width than the outgoing wire.

Every edge in the node graph (i.e. the one created during global routing) has a routing path. Each routing path has a layer number, a wire width, a list of strategies used to guide detailed routing and one or two polygons that represent the actual routing for the wire. Detailed routing may proceed from either end of the edge, or even both ends if the attempt from one end fails to reach the other (the stretch in between is referred to herein as an "unroute" and routing from both ends reduces the length of the unrouted section, sometimes allowing it to be completed), and there is one polygon per attempted end.

i. Moving Connection Points of Wires During Detailed Routing

Figure 11:
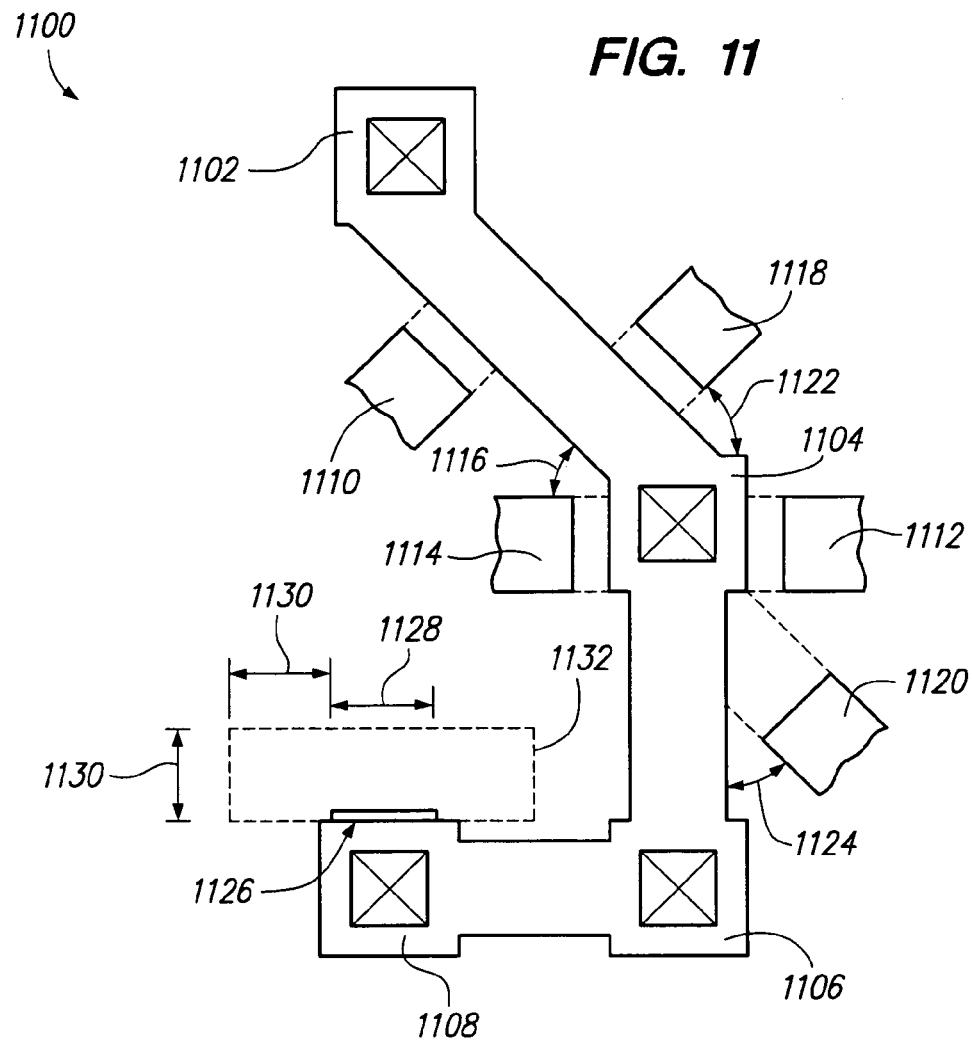
FIG. 11 is a block diagram illustrating changing connection points during detailed routing within the constraints of a set of applicable design rules according to an embodiment of the invention.

As previously described herein, routing reference points are provided to guide the routing of new wires to join points. Nevertheless, wires are not required to be connected only to the routing reference points, but can be connected to other locations, as determined during detailed routing. FIG. 11 is a block diagram that illustrates changing connection points during detailed routing within the constraints of a set of applicable design rules according to an embodiment of the invention.

An array of contacts join point 1100 includes four contacts, identified by reference numerals 1102, 1104, 1106 and 1108. Theoretically, a wire may be electrically connected to any location on array of contacts join point 1100. However, design rules limit the specific locations and/or angles or directions from which a wire may be connected to array of contacts join point 1100. For example, wires 1110 and 1112 can be connected to array of contacts join point 600 without violating any design rule spacing requirements. However, wire 1114 cannot be connected to contact 1104 from the illustrated direction since this would result in an acute angle between wire 1114 and array of contact join point 1100 as indicated by arrow 1116, which would violate design rule spacing requirements. Similarly, wires 1118 and 1120 cannot be connected to array of contacts join point 1100 due to spacing violations. That is, connecting wire 1118 or wire 1120 to array of contacts join point 1100 in the manner illustrated in FIG. 11 would cause a design rule spacing requirement violation because of the acute angle between wire 1118 and 1120, respectively, and array of contact join point 1100, as indicated by arrows 1122 and 1124, respectively.

As another example, suppose a wire (not illustrated) is to be connected to a routing target 1126 on contact 1108. Given a wire width indicated by arrows 1128 and minimum spacing requirements indicated by arrows 1130, a test area 1132 is defined for relocating the wire during detailed routing. If any geometry of the join point extends into the test area, the routing target site is illegal.

During detailed routing, the integrated circuit layout may be changed and join points may be moved to allow a wire to be successfully routed from a starting join point to an ending join point, or otherwise as necessary to satisfy applicable design rules. According to one embodiment of the invention, three types of changes are allowed including clipping the corner of a contact enclosure, clipping the corner of a transistor island and moving a join point. Clipping the corner of a contact enclosure has been previously described herein. Generally, corner clipping is performed whenever possible and the wire extended again. If no further progress is made, then the change is undone and the wire is bent as described in more detail hereinafter.

Figure 12:
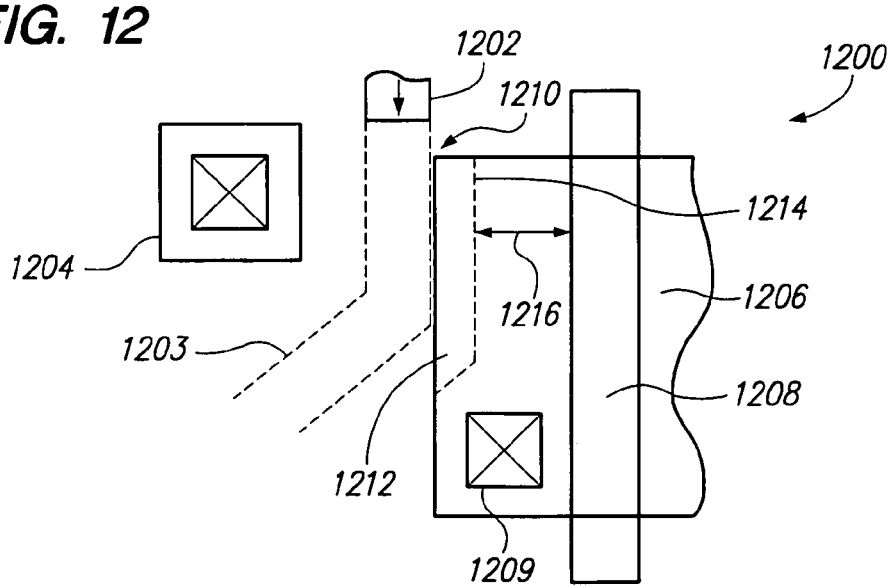
FIG. 12 is a block diagram illustrating an approach for clipping the corner of a transistor island according to an embodiment of the invention.

FIG. 12 is a block diagram 1200 that illustrates an approach for clipping the corner of a transistor island according to an embodiment of the invention. For purposes of this example, a polysilicon wire 1202 is being extended along a route 1203 between an obstacle on polysilicon 1204 and a transistor island comprised of a diffusion region 1206, a polysilicon gate 1208 and a source/drain contact 1209. Since the minimum required spacing between diffusion and polysilicon would not be satisfied in the region indicated by reference numeral 1210, a portion 1212 of diffusion region 1206 is removed, forming a new diffusion region boundary 1214 that satisfies the diffusion source/drain extension rule, as indicated by reference numeral 1216.

Clipping the corner of a contact enclosure or a transistor island can occur only if permitted by the applicable design rules. Moving a join point, within the constraints specified by the applicable design rules, can be performed during detailed routing only if the join point is movable, i.e., is not a transistor gate or a port, and has no wires attached to it. Wires are not ripped up during detailed routing. Rather, as previously described, an attempt is made to generate a complete wire from the starting join point to the ending join point and if the wire cannot be completed, e.g., because of an obstacle that cannot be circumvented, then obstacle resolution is pursued during global routing. According to one embodiment of the invention, when a wire cannot be successfully routed from a starting join point to an ending join point during detailed routing, then an error code is provided to global routing that indicates the reason why the routing could not be successfully complete. For example, the error code might indicate a design rule check violation that would occur if the wire were extended any further.

Figure 13A:
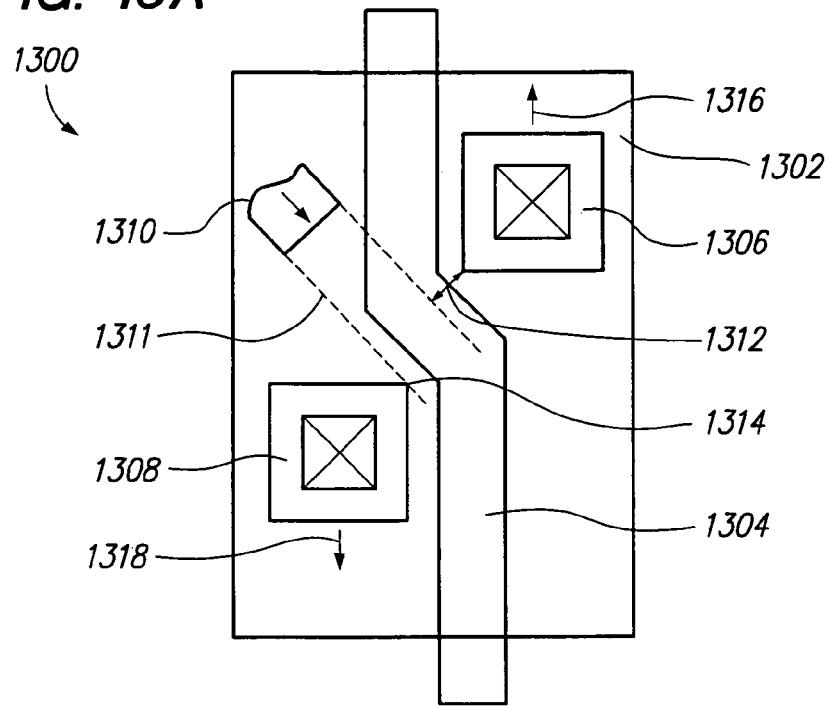
FIGS. 13A and 13B are block diagrams illustrating adjusting transistor source/drain contact placement to accommodate the routing of a new wire according to an embodiment of the invention.
Figure 13B:
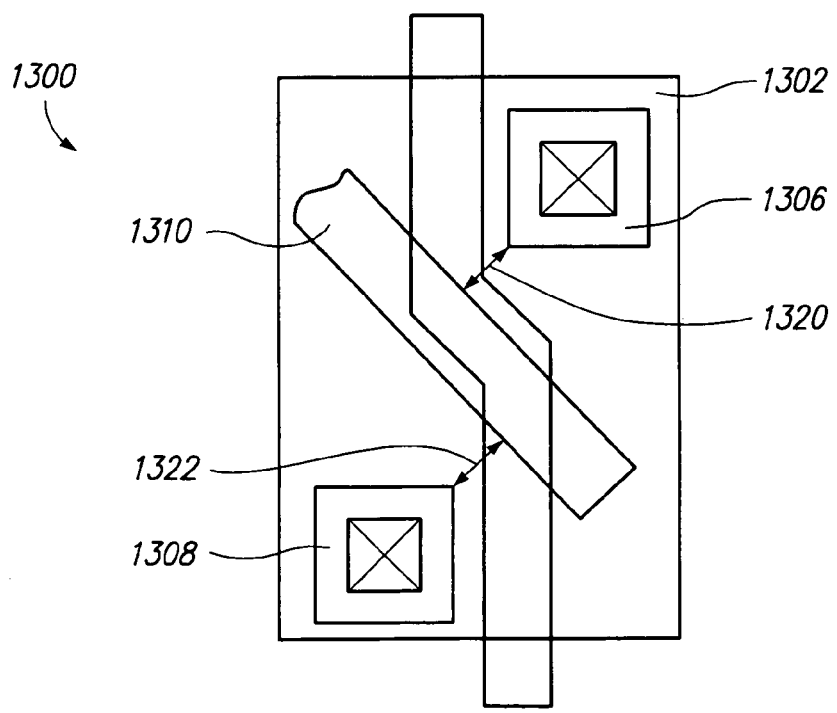

A special type of join point move, one appropriate only to a layout synthesis system, is to adjust a transistor source/drain contact placement within the limits calculated by the gate optimizer. FIGS. 13A and 13B are block diagrams that illustrate adjusting transistor source/drain contact placement to accommodate the routing of a new wire according to an embodiment of the invention. In FIG. 13A, a transistor island 1300 includes a diffusion region 1302 and a polysilicon gate 1304 routed between source/drain contact join points 1306 and 1308 that each include a top metal layer. A metal wire 1310 is to be routed between source/drain contact join points 1306 and 1308 along a path 1311. However, this cannot be accomplished without violating minimum metal-to-metal spacing requirements. Specifically, wire 1310 will violate the minimum spacing requirement indicated by reference numeral 1312 and will actually make contact with source/drain contact join point 1308 at location 1314.

According to an embodiment of the invention, the routing of wire 1310 between source/drain contact join points 1306 and 1308 is achieved as illustrated in FIG. 13B by moving source/drain contact join points 1306 and 1308 apart, as indicated by arrows 1316 and 1318, respectively, so that the metal-to-metal minimum spacing requirements are satisfied, as indicated by arrows 1320 and 1322. Note that the corners of source/drain contact join points 1306 and 1308 closest to wire 1310 could also be clipped to provide additional space to route wire 1310.

Moving a contact join point in the manner just described can increase the source/drain resistance of the transistor. Therefore, according to one embodiment of the invention, if further progress is not possible after moving a join point, the join point is moved back to its original location and the wire is bent instead. If progress is made, the change is stored in the change list for the wire being extended, as described in more detail hereinafter.

As previously described, transistors can be spread apart within a single transistor island or entire transistor islands spread apart during global routing. These are costly changes and are preferably performed during global routing because they require that existing wiring be ripped up.

ii. Change Lists

Change lists are used to record changes made to integrated circuit geometry while routing new wires during detailed routing. According to one embodiment of the invention, two change lists are generated for each new wire. One of the change lists records changes made (in order) to the integrated circuit layout geometry as a new wire is extended from the starting join point to the ending join point. The other change list records changes made (in order) to the integrated circuit layout geometry as the new wire is extended from the ending join point to the starting join point. Recall that a wire may be routed from the starting join point towards the ending join point, from the ending join point towards the starting join point, or both. In the event that the two wires meet, successfully completing the routing, then the polygons and change lists are combined. According to one embodiment of the invention, one of the change lists is appended onto the other in reverse order so that all changes are in sequence when read from the specified end towards the other.

According to one embodiment of the invention, each change is characterized by a change type, an object pointer, any parameters required for the change operation (such as a corner location), and the status of the object prior to the change (e.g. the previous amount of clipping, since enclosures can be clipped a bit at a time).

iii. Bending Wires

If a wire cannot be successfully routed even after clipping corners of a transistor island or a join point or by moving a join point out of the way, then the new wire is bent. Because the wire is being extended at a known end, the nature of the design rule violation can be used to determine the preferred bend directions for obstacle avoidance. The canonical direction is determined by the design rule check performed in step 1060 of FIG. 10B. For example, according to one embodiment of the invention using a wire comprising directed wire segments, the preferred bend direction is determined as described hereinafter with reference to FIGS. 14A-14H. Note that the bend directions here are determined for steps 1022 and 1026 of FIG. 10A.

Figure 14A:
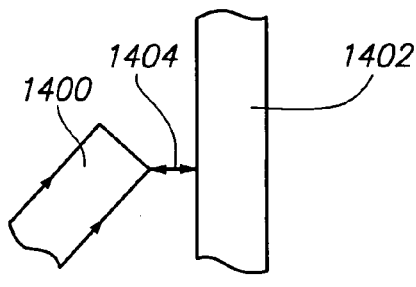
FIGS. 14A-14H are block diagrams illustrating an approach for determining a bend direction according to an embodiment of the invention.
Figure 14B:
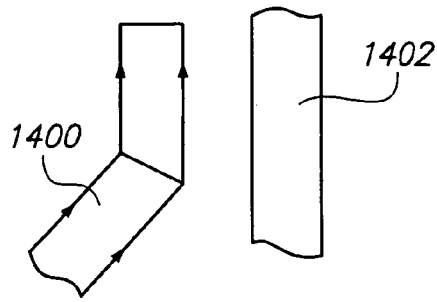

As illustrated in FIG. 14A, if the canonical direction from the end of a routing path 1400 to an obstacle 1402 is up and right, as indicated by arrow 1404, then the only allowable bend direction for routing path 1400 is up and to the left as illustrated in FIG. 14B, e.g., a forty-five degree bend. Any other direction would result in a U-turn which would require the routing path 1400 to be backed up and an earlier bend inserted.

Figure 14C:
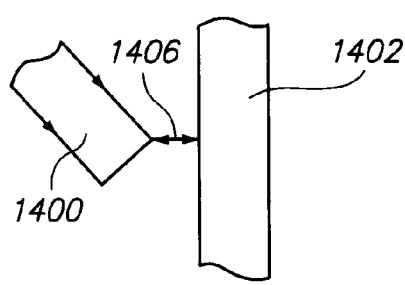
Figure 14D:
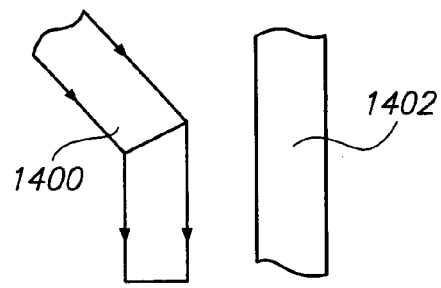

As illustrated in FIG. 14C, if the canonical direction from the end of routing path 1400 to obstacle 1402 is up and left, as indicated by arrow 1406, then the only allowable bend direction for routing path 1400 is up and to the right, as illustrated in FIG. 14D, e.g., a forty-five degree bend.

Figure 14E:
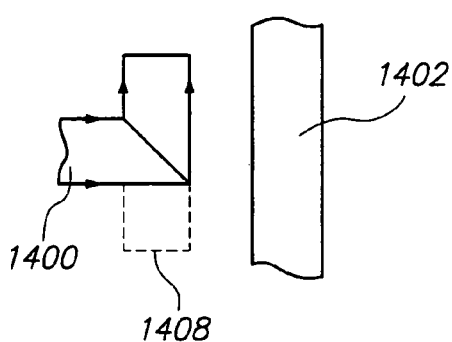
Figure 14F:
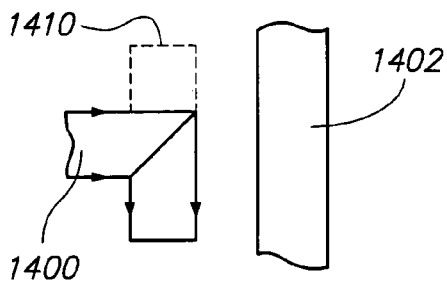

As illustrated in FIG. 14E, if the canonical direction from the end of routing path 1400 to obstacle 1402 is up, then the bias direction is examined to determine the preferred bend direction. If the bias direction is towards the left, then, as illustrated in FIG. 14E, routing path 1400 is bent to the left, e.g., with a ninety degree bend to the left. If the bias direction is towards the right, then, as illustrated in FIG. 14F, routing path 1400 is bent to the right, e.g., with a ninety degree bend to the right.

If routing path 1400 cannot be extended in the preferred direction due to further obstacles or because routing path 1400 has reached the edge of a valid region, i.e., by exceeding the straying limit, then the reverse direction is attempted before failing. For example, a right ninety degree bend 1408 (FIG. 14E) if the bias direction is left and a left ninety degree bend 1410 (FIG. 14F) if the bias direction is right.

Figure 14G:
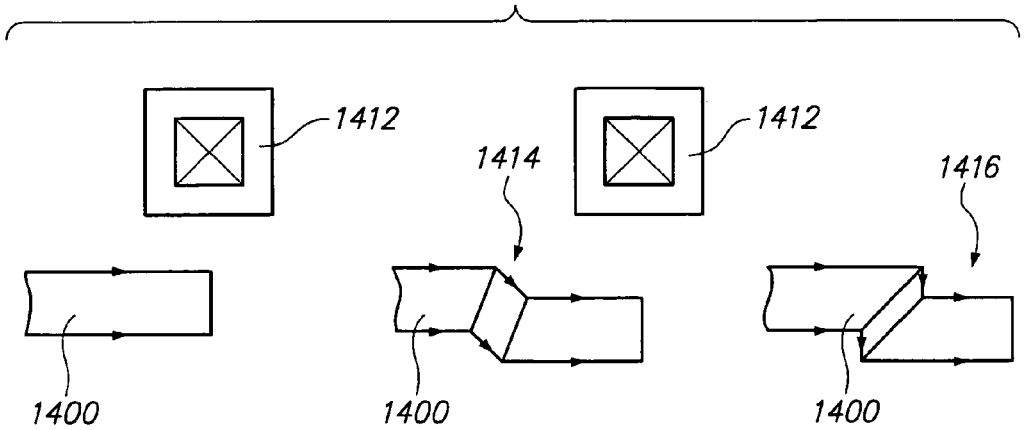

As illustrated in FIG. 14G, if the canonical direction from the end of routing path 1400 to an obstacle 1412 is left, then the detailed routing of routing path 1400 is backed up and a bend to the up and right is inserted, as illustrated by reference numeral 1414. If a bend to the up and right does not successfully circumvent obstacle 1412, then a right bend is inserted in routing path 1400 as illustrated by reference numeral 1416.

Figure 14H:
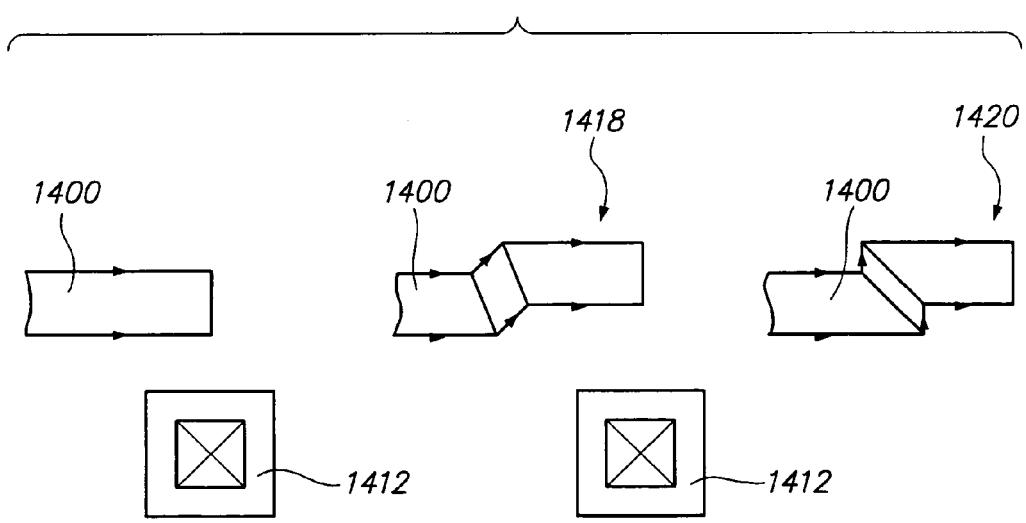

As illustrated in FIG. 14H, if the canonical direction from the end of routing path 1400 to obstacle 1412 is right, then the detailed routing of routing path 1400 is backed up and a bend to the up and left is inserted, as illustrated by reference numeral 1418. If a bend to the up and left does not successfully circumvent obstacle 1412, then a left bend is inserted in routing path 1400 as illustrated by reference numeral 1420.

d. Join Point Design Rule Checking

According to an embodiment of the invention, each layout polygon is tagged with identifying information, such as a type code and object indices, so that design rules may be checked effectively during detailed routing. For example, a transistor gate polygon has a type transistor island geometry (that it is a transistor is known from the layer it is on) and indices denoting which island contains the transistor gate and the location of the transistor gate within the island. Transistor source/drain contacts, well ties and diffusion polygons also have this type. Routing join point polygons have type join point and indices for the node number and point index within the graph representing the node. Routing path polygons have type routing path, an index for the node number and an index for the edge number within the graph. Other geometry, such as wells, implants, supply polygons, and perimeter (bounding) polygons would also have identifying types and tags. Thus when a design rule check is unsuccessful, the two affected polygons are used to determine the nature of the violation as well as implement high-level avoidance strategies. For example, if a polysilicon wire approaches the diffusion polygon of a transistor island, detailed routing would stop and the violation would be returned to the global router, which then either increases the straying limit for the routing stretch, generates hint polygons to guide routing around the transistor island, changes the routing layer to one which may cross over a transistor island, or backs off and tries another direction.

Figure 15:
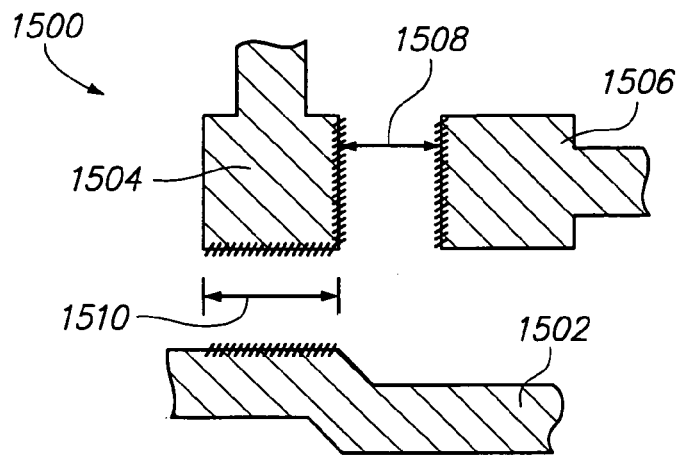
FIG. 15 is a block diagram illustrating the violation of a dogbone spacing rule attributable to an extension of a routing path according to an embodiment of the invention.

According to one embodiment of the invention, two types of design rule checks are performed: a join point design rule check and a routing path design rule check. The join point design rule check evaluates the geometry of a join point with respect to the surrounding layout geometry. The routing path design rule check evaluates the geometry of a routing path (or a section thereof) with respect to the surrounding layout geometry, as described in more detail hereinafter. Because geometry is always added to a region that meets design rules, any identified design rule errors are a direct result of the new layout geometry, even if the design rule errors are between unrelated layout geometry elements. For example, this occurs when the addition of a join point or routing path causes a dogbone spacing rule to be violated. FIG. 15 is a block diagram 1500 illustrating the violation of a dogbone spacing rule attributable to an extension of a routing path. Diagram 1500 includes a newly extended (metal) routing path 1502 adjacent to contact enclosures 1504 and 1506. For purposes of explanation, a typical spacing requirement may require a minimum of four units of separation between contact enclosures 1504 and 1506, as indicated by arrow 1508. An exception to this requirement is the so called "dogbone" rule which provides for an exception to the normal minimum spacing requirement and allows contact enclosures 1504 and 1506 to be closer together, so long as either contact enclosure 1504 or 1506 does not have a specified amount of one of its edges adjacent to another layout element. Thus, in the present example, if routing path 1502 were not present and contact enclosures 1504 and 1506 evaluated on their own, they would violate the standard spacing requirement, but would satisfy the dogbone exception. However, the amount of the lower edge of contact enclosure 1504 that is adjacent to routing path 1502, represented by reference numeral 1510, exceeds the specified amount. As a result, the presence of routing path 1502 causes a spacing violation between enclosure contacts 1504 and 1506 that did not exist prior to the extension of routing path 1502 adjacent to contact enclosure 1504. It should be noted that a looser definition of edge length that considers only two objects at a time does not result in this type of spacing error. However, it is sometimes preferable to perform a worst case evaluation.

An example of a join point design rule check implemented in pseudo code according to an embodiment of the invention includes the following steps:

```
for each layer in the join point do
  for each attached wire on the layer do
    if the "approach" flag for the wire end is not set then
      add the routing path polygon for the wiring end to an exclusion list
    endif
    if the "short path" flag for the graph edge of the wire is set then
      add all polygons for the join point at the other end of the edge to an exclusion list
    endif
  end # each attached wire
  for each polygon near the join point polygon do # on all layers
    compute the spacing between the two polygons according to the types of polygon, the layer numbers, and the design rules
    if a spacing does apply then
      if the polygons are too close together then # including definite dogbone error
        return that error
      endif # too close
      if the nearby polygon is on this layer and
         the nearby polygon is part of a join point and
         the polygons might be too close together and # i.e. might violate dogbone
         errors are being accumulated then
        remember the nearby join point
      endif
    endif # spacing applies
    compute the enclosure between the two polygons according to the types of polygon, the layer numbers, and the design rules
    if an enclosure does apply and the polygons do not meet the rule then
      return that error
    endif
  end #each polygon
end #each layer
if errors were accumulated and nearby join points may violate a dogbone rule then
  for each possibly violating nearby join point do
    run a join point DRC around that join point without accumulating further errors
    if a violation was found then
      return that violation # even though it may not refer to the new geometry
    endif
  end # each possibly violating join point
endif #may have violated
```

The computations required to check the correctness of spacing or enclosure, performed by an object passed to a generic spacing or enclosure checking routine, depend upon the design rules, the layer numbers, the polygon types, the wire width of each polygon, the edge length of each polygon, and whether the polygon near the join point is in any exclusion lists. For example, if the nearby polygon is a wide routing path, then the spacing requirement may be larger than normal unless the edge length of at least one of the two polygons is less than the dogbone edge length in the design rules. Other custom rule evaluations are possible as well, such as dogbone edge length requirements between wires of normal width or an extra spacing between polysilicon interconnect and transistor source/drain contacts.

According to one embodiment of the invention, the "worst" design rule violation is identified, as determined by specified criteria such as the distance the new data must be moved in order to fix the violation. Thus each violation found would be compared with the current worst, and the worst violation would be returned at the end of the procedure.

Figure 16:
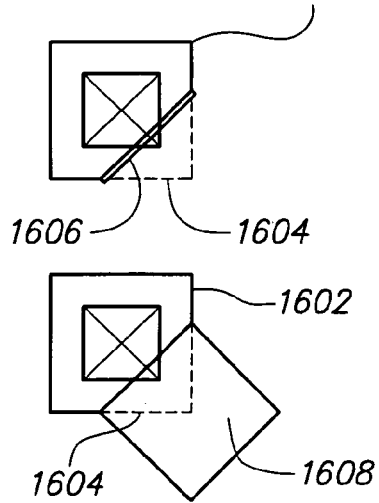
FIG. 16 is a block diagram illustrating an approach for reducing temporarily the enclosure around the contact when defining a wire attachment according to an embodiment of the invention.

The exclusion list applies to intralayer spacing checks for routing layers within the join point and interlayer enclosure checks for contact layers within the join point. If the two polygons are on the same routing layer and the nearby polygon is in the exclusion list, no spacing applies. If the join point polygon is on a contact layer and the nearby polygon is in the exclusion list, e.g., part of the same join point, then no enclosure applies. This allows the join point to reduce temporarily the enclosure around the contact when defining a wire attachment, knowing that the enclosure rule requirements will be met as soon as the routing path is drawn. For example, FIG. 16 is a block diagram 1600 that illustrates the approach of reducing temporarily the enclosure around the contact when defining a wire attachment. Diagram 1600 includes a contact enclosure join point 1602 with a reduced enclosure, indicated by reference numeral 1604, and a routing target 1606. The enclosure rule requirements are satisfied when a routing path 1608 is attached to contact enclosure join point 1602.

According to one embodiment of the invention, after a design rule check is performed, those join points that might possibly violate design rules are identified and remembered. For example, this occurs when a dogbone spacing violation might have occurred at a particular join point. If the nearby join point definitely violates a dogbone spacing rule to the join point being checked, that error is identified immediately. Otherwise, a join point design rule check is performed later for that join point to see if the total edge length in violation exceeds the design rule limit. To avoid infinite recursion, this join point design rule check does not identify nearby join points that might also violate the design rules. Rather, it is performed only because a single join point DRC does not consider all combinations of spacings, but only those that reference the join point under test.

e. Approaching Indicators for Design Rule Checking

It is necessary to ensure that routing paths do not come too close, i.e., violate spacing rules, to portions of join points other than routing targets. Therefore, according to one embodiment of the invention, each end of a routing path has an associated approaching indicator (flag). When the approaching indicator is asserted (set) for a particular end, then the routing path has not yet reached the join point and spacings between the routing path and the join point may be checked, especially locations other than the routing target. This ensures that the routing path does not violate a spacing rule for a part of the join point other than the routing target. Note that the design rule checks associated with join points ensure that routing targets for attached wires do not create design rule violations, except when the routing path is long enough to bend.

Once it is known that a routing path will not cause any design rule violations with the join point, the approaching indicator for the routing path is deasserted. Then the routing path is extended to abut the routing target on the join point, and subsequent routing path DRCs exclude the join point routing polygons from consideration.

Figure 17A:
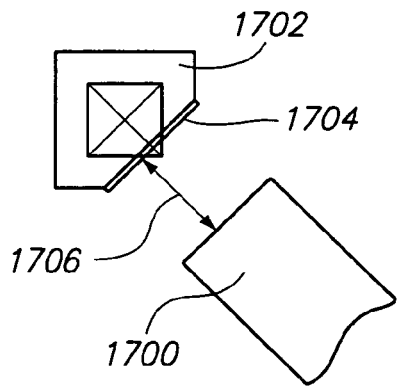
FIGS. 17A and 17B are block diagrams illustrating the use of approaching indicators during routing according to an embodiment of the invention.
Figure 17B:
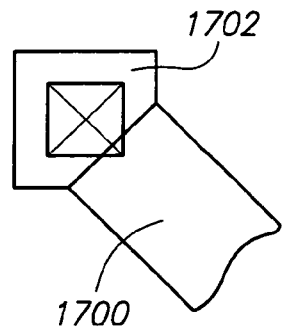

FIGS. 17A and 17B illustrate the use of approaching indicators according to an embodiment of the invention. In FIG. 17A, a routing path 1700 is being extended towards a contact enclosure join point 1702 and a routing target 1704. At this point, the approaching indicator for routing path 1700 is asserted and the spacing 1706 between routing path 1700 and routing target 1704 checked against applicable design rules. In FIG. 17B, the approaching indicator for routing path 1700 is deasserted (cleared) and consequently, the spacing between routing path 1700 and contact enclosure join point 1702 is not checked.

f. Short Path Indicators for Design Rule Checking

In some situations, a routing path connects two join points, in particular contact enclosure join points, that are close enough to each other to prevent a meaningful design rule check of the routing path from being performed. Similarly, the close proximity of the join points causes a design rule check of either join point to exclude the routing polygons for the other join point. The wire between the two join points, if any (they may abut), may be drawn wider than normal to avoid "notch" violations as well.

For example, in FIG. 18, two contact enclosure join points 1800 and 1802 are connected by a routing path 1804. Routing paths 1806 and 1808 are connected to contact enclosure join points 1800 and 1802, respectively. In this example, the close proximity of contact enclosure join points 1800 and 1802 violates a minimum spacing rule for contact enclosures, as indicated by reference numeral 1810, making a design rule check of contact enclosure join points 1800 and 1802 or routing path 1804 impractical.

In other situations, a single join point integrates two contacts for connecting two non-adjacent routing layers, e.g., first metal and third metal, when the contacts cannot be placed directly on top of each other. In these situations, the close proximity of the contacts prevents a meaningful design rule check from being performed. Referring again to FIG. 18, in this situation for example, routing path 1806 could be on a first metal layer, routing path 1804 on a second metal layer and routing path 1808 on a third metal layer. In this situation, contact enclosure join point 1800 would connect the first and second metal layers and contact enclosure join point 1802 would connect the second and third metal layers.

In view of the particular problems associated with very short routing paths between join points, according to an embodiment of the invention, these types of short paths are identified by a short path indicator. When the short path indicator for a routing path is asserted, then the routing path is a short routing path and the conventional routing path and join point design rule checks are not performed. Instead, the routing path and connected join points must be "correct by construction."

g. Routing Path Design Rule Checking

An example of a routing path design rule check implemented in pseudo code according to an embodiment of the invention is provided hereinafter. The design rule check of a routing path is similar to the design rule check of a join point except that the routing path has only a single layer and precisely two end join points, as opposed to an arbitrary number of attached edges.

```
build a Test Polygon from the routing path polygon
if the "approach" flag for the first end is not set then
   add all polygons in the join point at the first end to an
      exclusion list
   for each other routing path attached to the first join point do
      if the other routing path is on the same layer as the
         current routing path and
         the "approach" flag for this end of the other routing
            path is not set then
         add the near portion of the other routing path polygon
            to an exclusion list
         if the other routing path has the "short path" flag set
            then
            add all polygons in the join point at the other end of
               the other routing path to an exclusion list
         endif # short path
      endif # on same layer
   end # all other paths
endif
if the "approach" flag for the second end is not set then
   add all polygons in the join point at the second end to an
      exclusion list
   for each other routing path attached to the second join point
      do
      if the other routing path is on the same layer as the
         current routing path and
         the "approach" flag for this end of the other routing
            path is not set then
         add the near portion of the other routing path polygon
            to an exclusion list
         if the other routing path has the "short path" flag set
            then
            add all polygons in the join point at the other end of
               the other routing path to an exclusion list
         endif # short path
      endif
   end # all other paths
endif
for each polygon near the Tested Polygon do # on all layers
   compute the spacing between the two polygons according
      to the types of polygon, the layer numbers, and the
      design rules
   if a spacing does apply then
      if the polygons are too close together then # including
         definite dogbone error
         return that error
      endif # too close
```

```
    if the nearby polygon is on this layer and
        the nearby polygon is part of a join point and
        the polygons might be too close together and # i.e.
            might violate dogbone
        errors are being accumulated then
            remember the nearby join point
        endif
    endif # spacing does apply
    compute the enclosure between the two polygons accord-
        ing to the types of polygon, the layer numbers, and the
        design rules
    if an enclosure does apply and the polygons do not meet the
        rule then
        return that error
    endif
end # each polygon
if errors were accumulated and nearby join points may
violate a dogbone rule then
    for each possibly violating nearby join point do
        run a join point DRC around that join point without
            accumulating further errors
        if a violation was found then
            return that violation # even though it may not refer to
                the new geometry
        endif
    end # each possibly violating join point
endif # may have violated
```

The test polygon comprises enough of the routing path polygon to ensure that any newly created dogbone violations are reported. Specifically, the test polygon includes all of the newly extended routing path geometry plus a length of the existing wire that is at least as long as the dogbone edge length limit. This value is determined by the need to detect a dogbone spacing violation caused by the first unit of wire extension.

According to one embodiment of the invention, the entire routing path polygon may be used for the routing path design rule check, although this may be computationally expensive if the routing path is very long, for example in a in a chip-level router. It is generally more efficient to test a (relatively) small piece of the routing path and "move" it along the routing path being constructed.

The required spacings and enclosures are computed in the same way as for the join point design rule check. Again, the exclusion list is used for intralayer spacing checks to prevent the reporting of violations between the routing path and the join points at each end.

If the approaching indicator is not asserted for an end of a routing path, the routing path may violate spacing rules with respect to other routing paths that are approaching the same join point on the same layer. As a result, a portion of those routing paths must be excluded from the design rule check.

FIG. 19 is a block diagram 1900 that illustrates this situation. Routing paths 1902 and 1904 connect to contact enclosure join point 1906. In this situation, a design rule minimum spacing requirement is violated by the proximity of routing paths 1902 and 1904, as indicated by arrow 1908. Similarly, routing paths 1910, 1912 and 1914 connect to a branch join point 1916. In this situation, a design rule minimum spacing requirement is violated by the proximity of routing paths 1910 and 1912, as indicated by arrow 1918. Furthermore, a design rule minimum spacing requirement is violated by the proximity of routing paths 1912 and 1914, as indicated by arrow 1920.

Therefore, according to an embodiment of the invention, a final wire segment of the routing path is not checked against the final wire segments of the other routing paths attached to the same join point. This excludes only false errors because wire segments are convex and the final wire segment must be at least as long as the spacing rule. For example, in FIG. 20, a routing path 2000 comprising wire segments 2002 and 2004 and a routing path 2006 comprising wire segments 2008, 2010 and 2012 are attached to a contact enclosure join point 2014. According to an embodiment of the invention, spacing checks are not performed between wire segments 2002 and 2008. However, spacing checks are performed between wire segment 2004 and wire segments 2008, 2010 and 2012. Similarly, spacing checks are performed between wire segment 2010 and wire segments 2002 and 2004. Also, spacing checks are performed between wire segment 2012 and wire segments 2002 and 2004.

Figure 21:
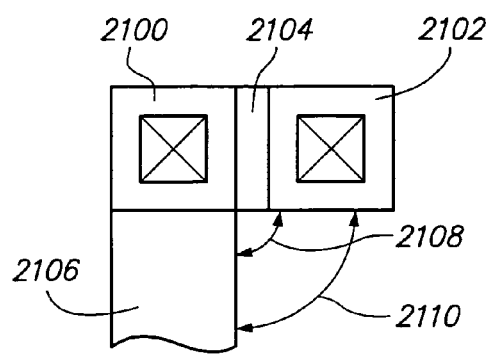
FIG. 21 is a block diagram illustrating an approach for performing design rule checks between routing paths and contact enclosure join points according to an embodiment of the invention.

If a routing path attached to a join point at an end of the first routing path has the short path indicator asserted, then there may be false spacing violations between the first routing path and the second join point. FIG. 21 illustrates two contact enclosure join points 2100 and 2102 connected by a routing path 2104. A routing path 2106 is connected to contact enclosure join point 2100. In this situation, a design rule check applied to routing path 2106 may falsely identify a spacing error 2108 between routing paths 2106 and 2104 and a spacing error 2110 between routing path 2106 and join point 2102. According to one embodiment of the invention, detailed routing ensures no true violations occur between routing path 2106 and contact enclosure join point 2102, for example, by allowing only certain types of adjacency between join points. For example, a transistor gate join point may have a straight branch join point attached to it when the gate join point is known not to curve back around such that it would interfere with the branch join point. Two single-contact join points may be placed adjacent to each other if for example a connection is to be made from polysilicon to the first metal layer in the first join point and from the first metal layer to the second metal layer in the second join point. Wires attached to the first join point on the first metal layer would otherwise have false violations reported to the second join point.

Once again, the addition of new geometry to the routing path may cause violations to appear on nearby join points, so it is necessary to run join point design rule checks centered around these join points in order to determine whether any dogbone violations are now present.

h. Tight Routing Situations

There are situations where two join points are so close together that there is insufficient room to site a routing path for an approach design rule check. For example, this occurs when two join points are just a bit further apart than the spacing rule, or the attachment directions are so constrained that the ends of the routing path to be completed cannot be aligned, or a hint polygon is placed very close to a join point or another hint polygon because of a restricted routing environment. In these situations, detailed routing might not be able to complete the routing path or routing stretch.

Therefore, according to one embodiment of the invention, if the distance to be routed is less than a specified multiple of the wire width, e.g., four times, a special-purpose tight routing approach is used to construct the routing stretch (or routing path) in one step, with no gaps between the routing path and the join points or hint polygons at its ends. Then a routing path design rule check is performed on the routing path with the approaching indicators deasserted to identify any design rule violations. If a design rule violation is detected somewhere along the constructed routing path, then an attached wire or hint polygon may be moved to cure the design rule violation. In certain situations, e.g., a one hundred thirty-five degree bend, the shape of the routing path can be changed to remedy the design rule error, either by selecting locations for the bends or by converting ninety degree (orthogonal) bends into separate forty-five degree (non-orthogonal) bends.

Figure 22A:
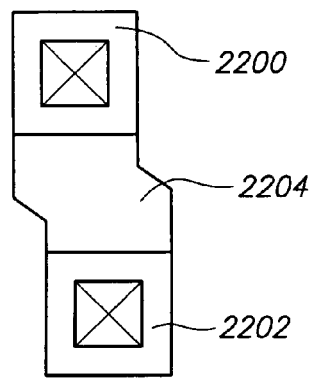
FIGS. 22A-22F are block diagrams illustrating performing a tight routing approach according to an embodiment of the invention.
Figure 22B:
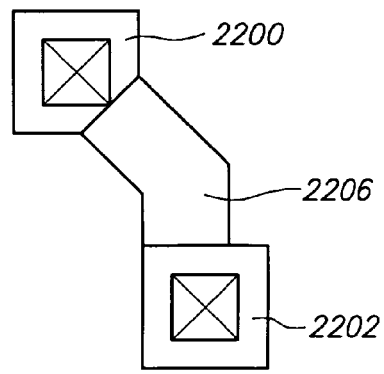

FIGS. 22A and 22B illustrate the use of the tight routing approach according to one embodiment of the invention. Specifically, in FIGS. 22A and 22B, a routing path is required between contact enclosure join points 2200 and 2202. In FIG. 22A, contact enclosure join points 2200 and 2202 are connected by a jogged (non-orthogonal) routing path 2204. In FIG. 22B, contact enclosure join points 2200 and 2202 are connected by a bent (non-orthogonal) routing path 2206.

Figure 22C:
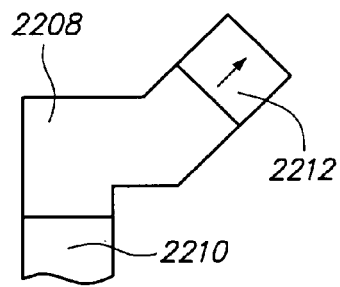

The tight routing approach is particularly useful when an attachment direction is constrained, e.g., at a transistor gate end, and the join point or hint polygon is offset to the side. For example, in FIG. 22C, a bent routing path 2208, generated in accordance with an embodiment of the invention, connects a transistor gate join point 2210 and a hint polygon (with routing direction) 2212.

Figure 22D:
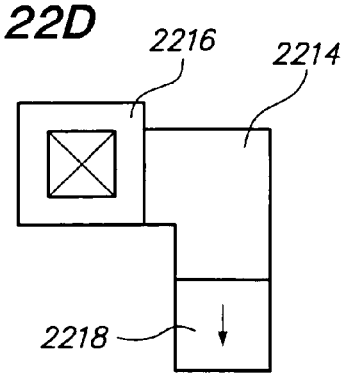
Figure 22E:
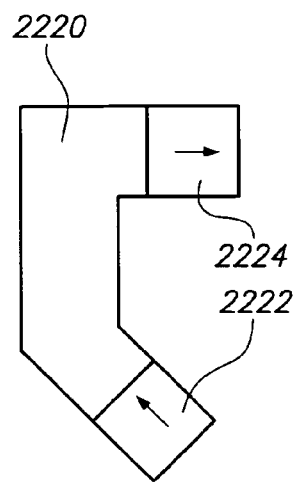

The tight routing approach is also useful when a wire attached to a join point is offset all the way to a corner. In this situation, the routing path may be bent before the spacing rule is met because no notch would be formed between it and the join point. Normally the routing path must travel far enough from the join point to meet the spacing rule before bending. However, if another routing path is attached near the location of the bend a violation will be created. For example, in FIG. 22D, a routing path 2214 connects a contact enclosure join point 2216 to a hint polygon that is offset from contact enclosure join point 2216 in a corner. In FIG. 22E, a routing path 2220, generated in accordance with the tight routing approach, connects hint polygons 2222 and 2224.

Figure 22F:
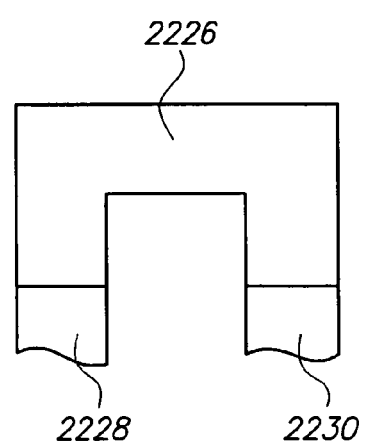

The tight routing approach is also useful when a U-turn must be made, for example, to connect two adjacent gate ends. This may be used even though detailed routing stops when a U-turn is required to prevent excessive searches. FIG. 22F illustrates the use of the tight routing approach to generate a routing path 2226 that connects transistor gate join points 2228 and 2230. Note that since other routing paths attached to the join point on the same layer are excluded from consideration in the routing path design rule check, the tight routing approach must not request that a wire be attached to a join point unless there are no nearby attached wires on that layer.

6. Obstacle and Insufficient Space Resolution

In the event that a wire cannot be routed because of an obstacle or insufficient space, then steps are taken to resolve the obstacle conflict and/or provide additional space in the integrated circuit layout to route the wire. According to one embodiment, any number of several approaches are employed to resolve obstacle conflicts and/or provide additional space. These include changing or adding hint polygons, changing the routing strategy, inserting one or more layer changes, instructing the detailed router to backup and insert a bend, ripping-up and rerouting one or more wires, or routing the wire from the destination connection point. Each of these steps is described in more detail hereinafter.

a. Change or Add Hint Polygons

Figure 23:
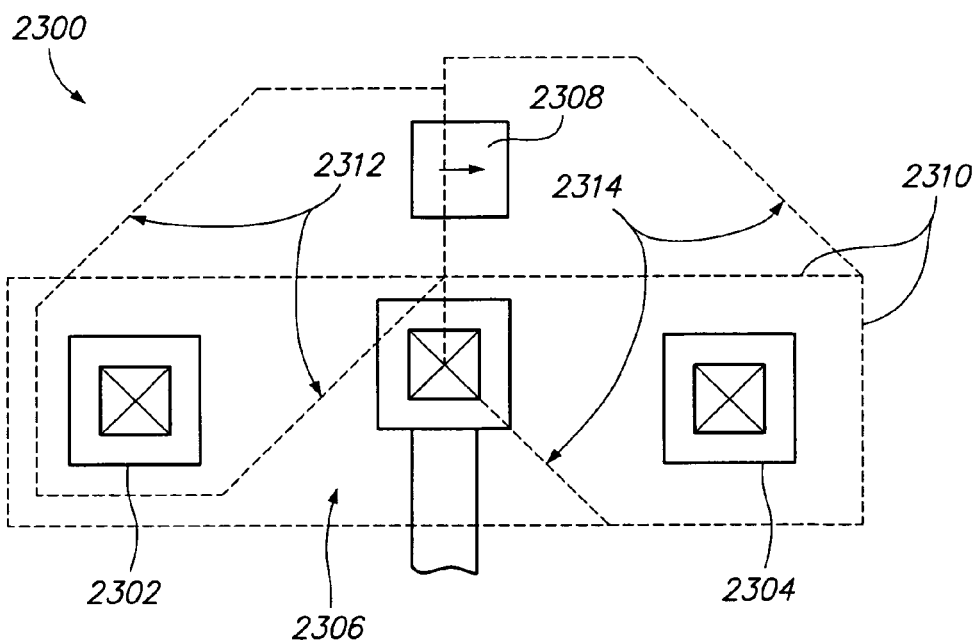
FIG. 23 is a block diagram illustrating an approach for resolving an obstacle conflict by adding a hint polygon to an integrated circuit layout according to an embodiment of the invention.

Global routing may change or add hint polygons to direct a routing path around an obstacle during detailed routing. FIG. 23 is a block diagram 2300 that illustrates adding a hint polygon to resolve an obstacle conflict according to an embodiment of the invention. Suppose a routing path needs to be routed between contact enclosure join points 2302 and 2304. An obstacle 2306 prevents the routing of a straight path between enclosure join points 2302 and 2304. In this example, detailed routing may not have been able to determine a design rule correct route between enclosure join points 2302 and 2304. In accordance with an embodiment of the invention, a hint polygon 2308 is added to guide the detailed routing of a routing path between enclosure join points 2302 and 2304.

b. Change Routing Strategy

Global routing may change the routing strategy for a particular routing path by changing the simple routing indicator, by adjusting the straying limits, or by changing the bias direction. Disabling the simple routing flag can provide additional space by allowing surrounding layout geometry to be moved or changed, e.g., by clipping corners.

Adjusting, e.g., increasing, the straying limit for a routing path can allow a routing path to be routed around an obstacle. Adjusting straying limits may be required in conjunction with adding one or more hint polygons, depending upon the location of the new hint polygons. As illustrated in FIG. 23, the original routing region is indicated by reference numeral 2310. Thus, even though new hint polygon 2308 has been added to guide the detailed routing of a routing path between enclosure join points 2302 and 2304, the routing cannot be accomplished without increasing the straying limits. Specifically, for the first stretch of the new routing path between enclosure join point 2302 and hint polygon 2308, the straying limits are increased as indicated by reference numeral 2312. For the second stretch of the new routing path between hint polygon 2308 and enclosure join point 2304, the straying limits are increased as indicated by reference numeral 2314.

Figure 24:
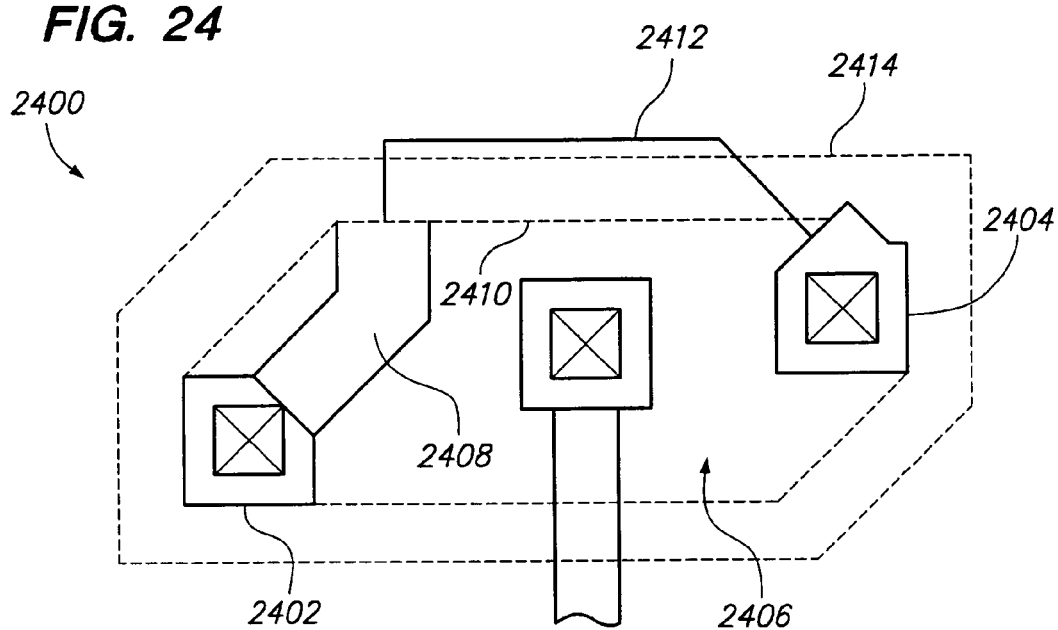
FIG. 24 is a block diagram illustrating an approach for resolving an obstacle conflict by adjusting straying limits according to an embodiment of the invention.

FIG. 24 is a block diagram 2400 that illustrates another example of increasing straying limits to avoid an obstacle according to an embodiment of the invention. Suppose a routing path is to be generated between enclosure join points 2402 and 2404. An obstacle 2406 prevents the routing of a straight path between enclosure join points 2402 and 2404. A routing path 2408 is started from enclosure join point 2402 but is stopped at boundary 2410 defined by the current straying limit, which may be zero. The intended routing path is represented by line 2412. According to an embodiment of the invention, the straying limit is increased to provided a larger routing region 2414 which allows routing path 2408 to be extended around obstacle 2406 and connect to contact enclosure join point 2404.

Global routing may also change the bias direction for a routing path so that when it is routed, or ripped up and rerouted, it avoids as much as possible an area desired for use by another routing path. This is simpler than inserting hint polygons. For example, it may be desirable to route a path towards the left side of an open region, rather than the middle, to provide space for a contact join point to be inserted later.

c. Insert One or More Layer Changes

Figure 25A:
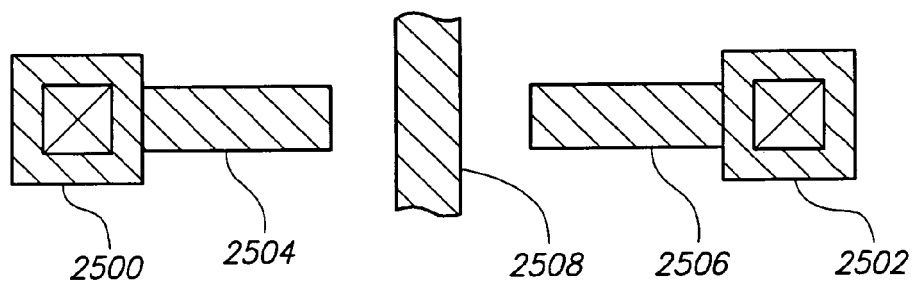
FIGS. 25A and 25B are block diagrams illustrating an approach for resolving an obstacle conflict by inserting a layer change according to an embodiment of the invention.
Figure 25B:
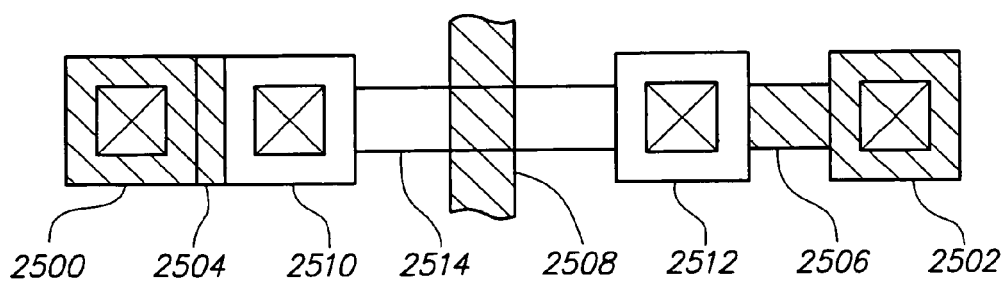

Global routing may insert one or more layer changes to route a routing path over or under an obstacle. FIGS. 25A and 25B illustrate an approach for avoiding an obstacle by inserting one or more layer changes to route a routing path over or under an obstacle according to an embodiment of the invention. In FIG. 25A, a routing path is to be routed between contact enclosure join points 2500 and 2502. Although routing paths 2504 and 2506 can be extended from contact enclosure join points 2500 and 2502, an obstacle 2508 prevents the routing from being completed.

In FIG. 25B, contact enclosure join points 2510 and 2512 are added and connected to routing paths 2504 and 2506, respectively, to provide a layer change to a different layer than the layer on which obstacle 2508 resides. Then a routing stretch 2514 is added to connect contact enclosure join points 2510 and 2512. For example, if contact enclosure join points 2500 and 2502 and obstacle 2508 are located on a first metal layer, then contact enclosure join points 2510 and 2512 can provide a connection to a second metal layer, which can include routing stretch 2514 to pass over obstacle 2508. The approach is also applicable to changing layers to route a routing stretch under and obstacle.

d. Instruct the Detailed Route to Backup and Insert a Bend

Global routing can also resolve an obstacle conflict by instructing the detailed routing to backup and insert a bend to route around an obstacle. FIG. 26 is a block diagram 2600 that illustrates the use of this approach to avoid an obstacle. A routing path 2602 is being extended towards an ending join point 2604, which in this example is a contact enclosure join point. An obstacle 2606 prevents routing path 2602 from reaching ending join point 2604. According to an embodiment of the invention, global routing instructs detailed routing to backup to a specified location and reroute routing path along a different path, indicated by reference numeral 2608.

e. Rip-Up and Reroute One or More Wires

Global routing may also rip up and reroute one or more routing paths to resolve an obstacle conflict. Should global routing rip up a routing path for strategic reasons, the changes are removed from the change lists one by one and the effects of each change are undone if possible. For example, if a contact enclosure corner was clipped, the corner is restored if it would not cause new design rule check violations (later routing might have taken advantage of the clipped corner as well). If a wire is only partially ripped up, only those changes required for the wire section removed are undone.

As previously described herein, clipping the corner of a contact enclosure may slightly reduce circuit production yield (a partially uncovered contact may not function properly, and clipping corners increases the odds that this may occur), so it is performed only when necessary to increase routing density and only in crowded areas. Similar logic applies to clipping transistor island corners or adjusting source/drain contacts; the transistor source/drain resistance may increase, slowing down the circuit slightly. Thus if a routing path is ripped up to make room for another wire, all of the join point and transistor island changes for that routing path are undone if possible. Routing added later may have taken advantage of the changes, so a design rule check must be run when restoring geometry. If an error is found, the change is left behind. Later rip-up may in turn remove the newer routing, so when all routing is complete the transistor island and join point corners are examined again to see if any corner clips can be restored.

f. Route Wire From Destination Connection Point

The global router may also attempt to draw the routing path from the other end; the length of the unroutable section can then be used to help determine the strategy to apply. For example, if the length is very short, e.g., not much more than the width of a single wire, then it may be advantageous to rip up the one or two wires intervening, then force those wires to go over the new one. If the wire length is long, e.g., a substantial fraction of the minimum possible routing path length, then the routing path will probably need to use a different layer. This is because the cost of removing all of the intervening geometry on the current layer is likely to be high.

7. Implementation Mechanisms

The approach for routing integrated circuits described herein is applicable to any type of integrated circuit design system and is independent of the particular design rules employed by a particular system. Furthermore, the approach may be implemented as part of an integrated circuit design system or as a stand-alone routing mechanism that interacts with a integrated circuit design system. The routing approach described herein may be implemented in hardware circuitry, in computer software, or a combination of hardware circuitry and computer software.

Figure 27:
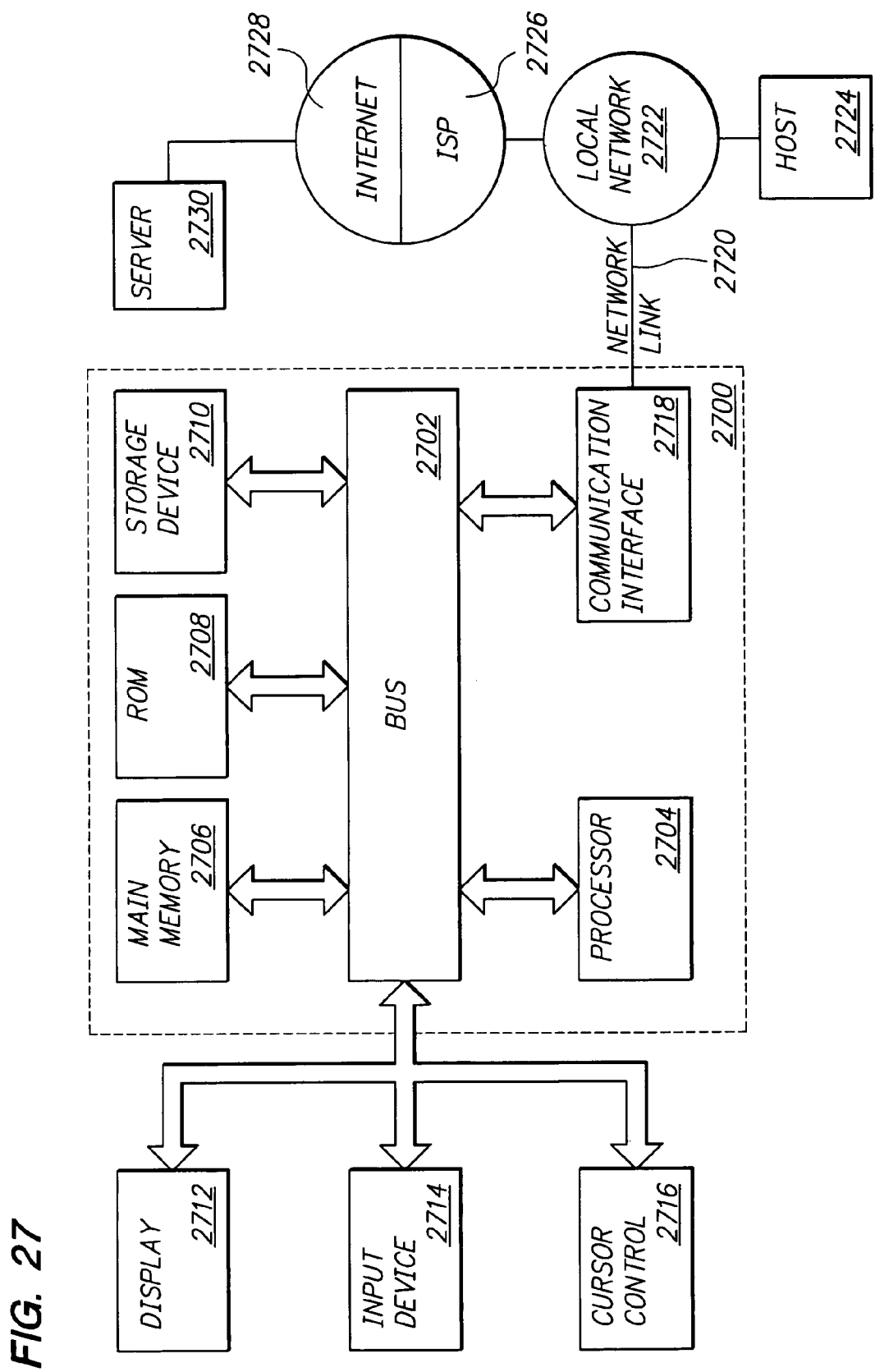
FIG. 27 is a block diagram of a computer system upon which embodiments of the invention may be implemented.

FIG. 27 is a block diagram that illustrates a computer system 2700 upon which an embodiment of the invention may be implemented. Computer system 2700 includes a bus 2702 or other communication mechanism for communicating information, and a processor 2704 coupled with bus 2702 for processing information. Computer system 2700 also includes a main memory 2706, such as a random access memory (RAM) or other dynamic storage device, coupled to bus 2702 for storing information and instructions to be executed by processor 2704. Main memory 2706 also may be used for storing temporary variables or other intermediate information during execution of instructions to be executed by processor 2704. Computer system 2700 further includes a read only memory (ROM) 2708 or other static storage device coupled to bus 2702 for storing static information and instructions for processor 2704. A storage device 2710, such as a magnetic disk or optical disk, is provided and coupled to bus 2702 for storing information and instructions.

Computer system 2700 may be coupled via bus 2702 to a display 2712, such as a cathode ray tube (CRT), for displaying information to a computer user. An input device 2714, including alphanumeric and other keys, is coupled to bus 2702 for communicating information and command selections to processor 2704. Another type of user input device is cursor control 2716, such as a mouse, a trackball, or cursor direction keys for communicating direction information and command selections to processor 2704 and for controlling cursor movement on display 2712. This input device typically has two degrees of freedom in two axes, a first axis (e.g., x) and a second axis (e.g., y), that allows the device to specify positions in a plane.

The invention is related to the use of computer system 2700 for routing integrated circuits. According to one embodiment of the invention, the routing of integrated circuits is provided by computer system 2700 in response to processor 2704 executing one or more sequences of one or more instructions contained in main memory 2706. Such instructions may be read into main memory 2706 from another computer-readable medium, such as storage device 2710. Execution of the sequences of instructions contained in main memory 2706 causes processor 2704 to perform the process steps described herein. One or more processors in a multi-processing arrangement may also be employed to execute the sequences of instructions contained in main memory 2706. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 2704 for execution. Such a medium may take many forms, including but not limited to, non-volatile media, volatile media, and transmission media. Non-volatile media includes, for example, optical or magnetic disks, such as storage device 2710. Volatile media includes dynamic memory, such as main memory 2706. Transmission media includes coaxial cables, copper wire and fiber optics, including the wires that comprise bus 2702. Transmission media can also take the form of acoustic or light waves, such as those generated during radio wave and infrared data communications.

Common forms of computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 2704 for execution. For example, the instructions may initially be carried on a magnetic disk of a remote computer. The remote computer can load the instructions into its dynamic memory and send the instructions over a telephone line using a modem. A modem local to computer system 2700 can receive the data on the telephone line and use an infrared transmitter to convert the data to an infrared signal. An infrared detector coupled to bus 2702 can receive the data carried in the infrared signal and place the data on bus 2702. Bus 2702 carries the data to main memory 2706, from which processor 2704 retrieves and executes the instructions. The instructions received by main memory 2706 may optionally be stored on storage device 2710 either before or after execution by processor 2704.

Computer system 2700 also includes a communication interface 2718 coupled to bus 2702. Communication interface 2718 provides a two-way data communication coupling to a network link 2720 that is connected to a local network 2722. For example, communication interface 2718 may be an integrated services digital network (ISDN) card or a modem to provide a data communication connection to a corresponding type of telephone line. As another example, communication interface 2718 may be a local area network (LAN) card to provide a data communication connection to a compatible LAN. Wireless links may also be implemented. In any such implementation, communication interface 2718 sends and receives electrical, electromagnetic or optical signals that carry digital data streams representing various types of information.

Network link 2720 typically provides data communication through one or more networks to other data devices. For example, network link 2720 may provide a connection through local network 2722 to a host computer 2724 or to data equipment operated by an Internet Service Provider (ISP) 2726. ISP 2726 in turn provides data communication services through the world wide packet data communication network now commonly referred to as the "Internet" 2728. Local network 2722 and Internet 2728 both use electrical, electromagnetic or optical signals that carry digital data streams. The signals through the various networks and the signals on network link 2720 and through communication interface 2718, which carry the digital data to and from computer system 2700, are exemplary forms of carrier waves transporting the information.

Computer system 2700 can send messages and receive data, including program code, through the network(s), network link 2720 and communication interface 2718. In the Internet example, a server 2730 might transmit a requested code for an application program through Internet 2728, ISP 2726, local network 2722 and communication interface 2718. In accordance with the invention, one such downloaded application provides for the routing of integrated circuits as described herein.

The received code may be executed by processor 2704 as it is received, and/or stored in storage device 2710, or other non-volatile storage for later execution. In this manner, computer system 2700 may obtain application code in the form of a carrier wave.

The novel approach described herein for routing an integrated circuit provides several advantages over prior routing approaches. One advantage is that design rule checks may be performed on an object-specific basis. This provides increased flexibility during verification of an integrated circuit design. One benefit of this increased flexibility is that it allows object-specific design rules to be employed, for example, in phase-shift masking applications to reduce line width. Another benefit of the increased flexibility is that the design rules for any particular object may change over time, independent of the design rules applied to other objects in a layout. This is particularly important for supporting "landing zone" rules.

Prior art routers are incapable of making room for new wires except by separating cells, i.e., by adding feedthroughs in a row of cells, or transistor islands (in an intracell router). By moving or modifying obstacles only enough to allow a wire to approach, more room is left to add wires on the other side. Thus the routing for the integrated circuit generated in accordance with the present invention can be made more dense than is possible with a coarse-grid or orthogonal router.

The combination of an obstacle-moving detailed router and an obstacle-avoiding global router promotes algorithmic simplicity, execution speed, and router capability. The global router need not set up strategies for individual routing paths until an obstacle is found, meaning that a large fraction of wires may be routed without intervention. Once an obstacle is found, the global router can use its high-level knowledge of major obstacles, e.g., transistor islands, to define an evasion strategy. The use of hint polygons and straying limits allows an efficient, goal-directed ("depth first") search mechanism without concern for the suboptimal routing common to this type of approach as used in conventional routing approaches. The algorithms of the detailed router are also simpler because they do not need to consider layer changes or expend significant effort traveling around obstacles. Major changes are made by the global router; minor changes are made by the detailed router. Furthermore, significant performance advantages are achieved by partitioning tasks, e.g., design rule checks, between join points and routing tasks. Another advantage is provided by the tight routing mechanism described herein to handle tight routing situations.

In the foregoing specification, the invention has been described with reference to specific embodiments thereof. However, various modifications and changes may be made thereto without departing from the broader spirit and scope of the invention. The specification and drawings are, accordingly, to be regarded in an illustrative sense rather than a restrictive sense.

What is claimed is:

1. A volatile or non-volatile computer-readable medium carrying a set of one or more instructions for automatically routing an integrated circuit, the set of one or more instructions including instructions which, when executed by one or more processors, cause the one or more processors to perform the steps of:
   receiving integrated circuit layout data that defines a set of two or more integrated circuit devices to be included in the integrated circuit;
   receiving integrated circuit connection data that specifies one or more electrical connections to be made between the integrated circuit devices;
   determining, based upon the integrated circuit layout data and the integrated circuit connection data, a set of two or more join points that are to be electrically connected, wherein each join point from the set of two or more join points has an associated set of join point-specific design criteria that control attachment of routing paths thereto;

determining, based upon the integrated circuit layout data and the set of two or more join points, one or more routing paths to connect the set of two or more join points, wherein the one or more routing paths satisfy the join point-specific design criteria associated with the set of two or more join points; and updating the integrated circuit layout data to generate updated integrated circuit layout data that reflects the one or more routing paths.

2. A volatile or non-volatile computer-readable medium carrying a set of one or more instructions for automatically routing an integrated circuit using a gridless router, the set of one or more instructions including instructions which, when executed by one or more processors, cause the one or more processors to perform the steps of:

receiving integrated circuit layout data that defines a set of two or more integrated circuit devices to be included in the integrated circuit;

receiving integrated circuit connection data that specifies one or more electrical connections to be made between the integrated circuit devices;

determining, based upon the integrated circuit layout data and the integrated circuit connection data, a set of one or more routing indicators that specify a set of one or more preferable intermediate routing locations through which a routing path is to be located to connect first and second integrated circuit devices from the set of two or more integrated circuit devices;

determining, based upon the integrated circuit layout data, the integrated circuit connection data and the set of one or more routing indicators, the routing path between the first and second integrated circuit devices, wherein the routing path satisfies specified design criteria and wherein at least a center line of at least a portion of the routing path is not on a coordinate that is a multiple of a routing pitch of the routing path; and updating the integrated circuit layout data to generate updated integrated circuit layout data that reflects the routing path between the first and second integrated circuit devices.

3. The volatile or non-volatile computer-readable medium as recited in claim 2, wherein determining the routing path includes determining, based upon the integrated circuit layout data, the integrated circuit connection data, bias direction criteria and straying limit criteria, the routing path between the first and second integrated circuit devices, wherein the bias direction criteria specifies a preferred routing direction for a routing path between first and second integrated circuit devices from the set of two or more integrated circuit devices and the straying limit criteria defines a routing region in which the routing path between the first and second integrated circuit devices may be placed.

4. The volatile or non-volatile computer-readable medium as recited in claim 2, wherein determining the routing path between the first and second integrated circuit devices includes identifying one or more obstacles that block the routing path, determining, based upon the integrated circuit layout data, the integrated circuit connection data and the one or more obstacles, one or more additional routing indicators that specify one or more preferable routing locations through which the routing path is to be located to avoid the one or more obstacles, and determining, based upon the integrated circuit layout data, the integrated circuit connection data, the set of one or more routing indicators and the one or more additional routing indicators, the routing path between the first and second integrated circuit devices.

5. The volatile or non-volatile computer-readable medium as recited in claim 2, wherein determining the routing path between the first and second integrated circuit devices includes identifying one or more obstacles that block the routing path, changing specified straying limit criteria that defines a routing region in which the routing path between the first and second integrated circuit devices may be placed to generate changed specified straying limit criteria that defines a modified routing region, and determining, based upon the integrated circuit layout data, the integrated circuit connection data, the set of one or more routing indicators and the changed specified straying limit criteria, the routing path between the first and second integrated circuit devices.

6. The volatile or non-volatile computer-readable medium as recited in claim 2, wherein determining the routing path between the first and second integrated circuit devices includes identifying one or more obstacles that block the routing path, determining a set of one or more layer changes to allow the routing path to avoid the one more obstacles, and determining, based upon the integrated circuit layout data, the integrated circuit connection data, the set of one or more routing indicators and the set of one or more layer changes, the routing path between the first and second integrated circuit devices.

7. The volatile or non-volatile computer-readable medium as recited in claim 2, wherein determining the routing path between the first and second integrated circuit devices includes identifying one or more obstacles that block the routing path, determining a set of one or more bends to be included in the routing path to avoid the one more obstacles, and determining, based upon the integrated circuit layout data, the integrated circuit connection data, the set of one or more routing indicators and the set of one or more bends, the routing path between the first and second integrated circuit devices.

8. The volatile or non-volatile computer-readable medium as recited in claim 2, wherein determining the routing path between the first and second integrated circuit devices includes identifying one or more obstacles that block the routing path, determining one or more portions of the routing path to be ripped up and rerouted, and determining, based upon the integrated circuit layout data, the integrated circuit connection data, the set of one or more routing indicators and the one or more portions of the routing path to be ripped up and rerouted, the routing path between the first and second integrated circuit devices.

9. The volatile or non-volatile computer-readable medium as recited in claim 8, wherein determining the routing path between the first and second integrated circuit devices further includes determining one or more portions of one or more other routing paths to be ripped up and rerouted, and determining, based upon the integrated circuit layout data, the integrated circuit connection data, the set of one or more routing indicators, the one or more portions of the routing path to be ripped up and rerouted and the one or more portions of the one or more other routing paths to be ripped up and rerouted, the routing path between the first and second integrated circuit devices.

10. The volatile or non-volatile computer-readable medium as recited in claim 2, wherein determining the routing path between the first and second integrated circuit devices further includes identifying one or more obstacles that block the routing path, determining one or more portions of one or more other routing paths to be ripped up and rerouted, and determining, based upon the integrated circuit layout data, the integrated circuit connection data, the set of one or more routing indicators and the one or more portions of the one or more other routing paths to be ripped up and rerouted, the routing path between the first and second integrated circuit devices.

11. The volatile or non-volatile computer-readable medium as recited in claim 2, wherein determining the routing path between the first and second integrated circuit devices includes identifying one or more obstacles that block the routing path, and determining, based upon the integrated circuit layout data, the integrated circuit connection data and the set of one or more routing indicators, the routing path between the first and second integrated circuit devices, wherein the routing path is routed from the second integrated circuit device to the first integrated circuit device.

12. The volatile or non-volatile computer-readable medium as recited in claim 2, wherein determining the routing path between the first and second integrated circuit devices includes identifying one or more obstacles that block the routing path, determining one or more locations to employ corner clipping to provide additional space for the routing path, and determining, based upon the integrated circuit layout data, the integrated circuit connection data, the set of one or more routing indicators and the one or more locations to employ corner clipping, the routing path between the first and second integrated circuit devices.

13. The volatile or non-volatile computer-readable medium as recited in claim 2, wherein determining the routing path between the first and second integrated circuit devices includes identifying one or more obstacles that block the routing path, determining one or more integrated circuit layout objects to be moved to provide additional space for the routing path, and determining, based upon the integrated circuit layout data, the integrated circuit connection data, the set of one or more routing indicators and moving the one or more integrated circuit layout objects, the routing path between the first and second integrated circuit devices.

14. The volatile or non-volatile computer-readable medium as recited in claim 2, wherein determining the routing path between the first and second integrated circuit devices includes examining data that indicates whether changes can be made to one or more layout objects defined by the integrated circuit layout data to accommodate the routing of the routing path, and if the data indicates that changes can be made to the one or more layout objects defined by the integrated circuit layout data to accommodate the routing of the routing path, then making one or more changes to the one or more layout objects defined by the integrated circuit layout data, and determining, based upon the integrated circuit layout data, the integrated circuit connection data, the set of one or more routing indicators and the one or more changes made to the one or more layout objects, the routing path between the first and second integrated circuit devices.

15. The volatile or non-volatile computer-readable medium as recited in claim 14, further comprising generating data that specifies the one or more changes made to the one or more layout objects.

16. The volatile or non-volatile computer-readable medium as recited in claim 2, wherein determining the routing path between the first and second integrated circuit devices includes determining a set of one or more routing targets to which the routing path is to be routed, and determining, based upon the integrated circuit layout data, the integrated circuit connection data, the set of one or more routing indicators and the set of one or more routing targets, the routing path between the first and second integrated circuit devices.

17. The volatile or non-volatile computer readable medium as recited in claim 2, wherein all attachment and bend angles defined by the updated integrated circuit layout data are multiples of ninety degrees.

18. The volatile or non-volatile computer readable medium as recited in claim 2, wherein one or more attachment or bend angles defined by the updated integrated circuit layout data are multiples of other than ninety degrees.

19. A volatile or non-volatile computer-readable medium carrying a set of one or more instructions for automatically routing an integrated circuit, the set of one or more instructions including instructions which, when executed by one or more processors, cause the one or more processors to perform the steps of:

receiving integrated circuit layout data that defines a set of two or more integrated circuit devices to be included in the integrated circuit;

receiving integrated circuit connection data that specifies one or more electrical connections to be made between the integrated circuit devices;

determining, based upon the integrated circuit layout data and the integrated circuit connection data, a set of one or more routing indicators that specify a set of one or more preferable intermediate routing locations through which a routing path is to be located to connect first and second integrated circuit devices from the set of two or more integrated circuit devices;

determining, based upon the integrated circuit layout data, the integrated circuit connection data and the set of one or more routing indicators, the routing path between the first and second integrated circuit devices, wherein the routing path satisfies specified design criteria and wherein at least two routing indicators from the set of one or more routing indicators are separated from the first and second integrated circuit devices and one or more other routing indicators from the set of the one or more routing indicators by at least a specified distance, where the specified distance is greater than a width of the routing path; and updating the integrated circuit layout data to generate updated integrated circuit layout data that reflects the routing path between the first and second integrated circuit devices.

20. A system for automatically routing an integrated circuit, the system comprising:

a data storage mechanism having stored therein
integrated circuit layout data that defines a set of two or more integrated circuit devices to be included in the integrated circuit;
integrated circuit connection data that specifies one or more electrical connections to be made between the integrated circuit devices;

a routing mechanism communicatively coupled to the data storage mechanism, the routing mechanism being configured to
determine, based upon the integrated circuit layout data and the integrated circuit connection data, a set of two or more join points that are to be electrically connected, wherein each join point from the set of two or more join points has an associated set of join point-specific design criteria that control attachment of routing paths thereto;
determine, based upon the integrated circuit layout data and the set of two or more join points, one or more routing paths to connect the set of two or more join points, wherein the one or more routing paths satisfy the join point-specific design criteria associated with the set of two or more join points; and
update the integrated circuit layout data to generate updated integrated circuit layout data that reflects the one or more routing paths.

21. A system for automatically routing an integrated circuit using a gridless router, the system comprising:

a data storage mechanism having stored therein
integrated circuit layout data that defines a set of two or more integrated circuit devices to be included in the integrated circuit;
integrated circuit connection data that specifies one or more electrical connections to be made between the integrated circuit devices;

a routing mechanism communicatively coupled to the data storage mechanism, the routing mechanism being configured to
determine, based upon the integrated circuit layout data and the integrated circuit connection data, a set of one or more routing indicators that specify a set of one or more preferable intermediate routing locations through which a routing path is to be located to connect first and second integrated circuit devices from the set of two or more integrated circuit devices;
determine, based upon the integrated circuit layout data, the integrated circuit connection data and the set of one or more routing indicators, the routing path between the first and second integrated circuit devices, wherein the routing path satisfies specified design criteria and wherein at least a portion of the routing path is not on a coordinate that is a multiple of a routing pitch of the routing path; and update the integrated circuit layout data to generate updated integrated circuit layout data that reflects the routing path between the first and second integrated circuit devices.

22. A system for automatically routing an integrated circuit, the system comprising:

a data storage mechanism having stored therein
integrated circuit layout data that defines a set of two or more integrated circuit devices to be included in the integrated circuit;
integrated circuit connection data that specifies one or more electrical connections to be made between the integrated circuit devices;

a routing mechanism communicatively coupled to the data storage mechanism, the routing mechanism being configured to
determine, based upon the integrated circuit layout data and the integrated circuit connection data, a set of one or more routing indicators that specify a set of one or more preferable intermediate routing locations through which a routing path is to be located to connect first and second integrated circuit devices from the set of two or more integrated circuit devices;
determine, based upon the integrated circuit layout data, the integrated circuit connection data and the set of one or more routing indicators, the routing path between the first and second integrated circuit devices, wherein the routing path satisfies specified design criteria and wherein at least two routing indicators from the set of one or more routing indicators are separated from the first and second integrated circuit devices and one or more other routing indicators from the set of the one or more routing indicators by at least a specified distance, where the specified distance is greater than a width of the routing path; and
update the integrated circuit layout data to generate updated integrated circuit layout data that reflects the routing path between the first and second integrated circuit devices.

23. The system of claim 21, wherein the routing mechanism is further configured to
determine, based upon the integrated circuit layout data, the integrated circuit connection data, bias direction criteria and strafing limit criteria, the routing path between the first and second integrated circuit devices, wherein the bias direction criteria specifies a preferred routing direction for a routing path between first and second integrated circuit devices from the set of two or more integrated circuit devices and the straying limit criteria defines a routing region in which the routing path between the first and second integrated circuit devices may be placed.

24. The system of claim 21, wherein the routing mechanism is further configured to
identify one or more obstacles that block the routing path,
determine, based upon the integrated circuit layout data, the integrated circuit connection data and the one or more obstacles, one or more additional routing indicators that specify one or more preferable routing locations though which the routing path is to be located to avoid the one or more obstacles, and
determine, based upon the integrated circuit layout data, the integrated circuit connection data, the set of one or more routing indicators and the one or more additional routing indicators, the routing path between the first and second integrated circuit devices.

25. The system of claim 21, wherein the routing mechanism is further configured to
   identify one or more obstacles that block the routing path,
   change specified strafing limit criteria that defines a routing region in which the routing path between the first and second integrated circuit devices may be placed to generate changed specified strafing limit criteria that defines a modified routing region, and
   determine, based upon the integrated circuit layout data, the integrated circuit connection data, the set of one or more routing indicators and the changed specified strafing limit criteria, the routing path between the first and second integrated circuit devices.

26. The system of claim 21, wherein the routing mechanism is further configured to
   identify one or more obstacles that block the routing path,
   determine a set of one or more layer changes to allow the routing path to avoid the one more obstacles, and
   determine, based upon the integrated circuit layout data, the integrated circuit connection data, the set of one or more routing indicators and the set of one or more layer changes, the routing path between the first and second integrated circuit devices.

27. The system of claim 21, wherein the routing mechanism is further configured to
   identify one or more obstacles that block the routing path,
   determine a set of one or more bends to be included in the routing path to avoid the one more obstacles, and
   determine, based upon the integrated circuit layout data, the integrated circuit connection data, the set of one or more routing indicators and the set of one or more bends, the routing path between the first and second integrated circuit devices.

28. The system of claim 21, wherein the routing mechanism is further configured to
   identify one or more obstacles that block the routing path,
   determine one or more portions of the routing path to be ripped up and rerouted, and
   determine, based upon the integrated circuit layout data, the integrated circuit connection data, the set of one or more routing indicators and the one or more portions of the routing path to be ripped up and rerouted, the routing path between the first and second integrated circuit devices.

29. The system of claim 28, wherein the routing mechanism is further configured to
   determine one or more portions of one or more other routing paths to be ripped up and rerouted, and
   determine, based upon the integrated circuit layout data, the integrated circuit connection data, the set of one or more routing indicators, the one or more portions of the routing path to be ripped up and rerouted and the one or more portions of the one or more other routing paths to be ripped up and rerouted, the routing path between the first and second integrated circuit devices.

30. The system of claim 21, wherein the routing mechanism is further configured to
   identify one or more obstacles that block the routing path,
   determine one or more portions of one or more other routing paths to be ripped up and rerouted, and
   determine, based upon the integrated circuit layout data, the integrated circuit connection data, the set of one or more routing indicators and the one or more portions of the one or more other routing paths to be ripped up and rerouted, the routing path between the first and second integrated circuit devices.

31. The system of claim 21, wherein the routing mechanism is further configured to
   identify one or more obstacles that block the routing path, and
   determine, based upon the integrated circuit layout data, the integrated circuit connection data and the set of one or more routing indicators, the routing path between the first and second integrated circuit devices, wherein the routing path is routed from the second integrated circuit device to the first integrated circuit device.

32. The system of claim 21, wherein the routing mechanism is further configured to
   identify one or more obstacles that block the routing path,
   determine one or more locations to employ corner clipping to provide additional space for the routing path, and
   determine, based upon the integrated circuit layout data, the integrated circuit connection data, the set of one or more routing indicators and the one or more locations to employ corner clipping, the routing path between the first and second integrated circuit devices.

33. The system of claim 21, wherein the routing mechanism is further configured to
   identify one or more obstacles that block the routing path,
   determine one or more integrated circuit layout objects to be moved to provide additional space for the routing path, and
   determine, based upon the integrated circuit layout data, the integrated circuit connection data, the set of one or more routing indicators and moving the one or more integrated circuit layout objects, the routing path between the first and second integrated circuit devices.

34. The system of claim 21, wherein the routing mechanism is further configured to
   examine data that indicates whether changes can be made to one or more layout objects defined by the integrated circuit layout data to accommodate the routing of the routing path, and
   if the data indicates that changes can be made to the one or more layout objects defined by the integrated circuit layout data to accommodate the routing of the routing path, then
      make one or more changes to the one or more layout objects defined by the integrated circuit layout data, and
      determine, based upon the integrated circuit layout data, the integrated circuit connection data, the set of one or more routing indicators and the one or more changes made to the one or more layout objects, the routing path between the first and second integrated circuit devices.

35. The system of 34, wherein the routing mechanism is further configured to
   generate data that specifies the one or more changes made to the one or more layout objects.

36. The system of claim 21, wherein the routing mechanism is further configured to
   determine a set of one or more routing targets to which the routing path is to be routed, and
   determine, based upon the integrated circuit layout data, the integrated circuit connection data, the set of one or more routing indicators and the set of one or more routing targets, the routing path between the first and second integrated circuit devices.

37. The system of claim 21, wherein all attachment and bend angles defined by the updated integrated circuit layout data are multiples of ninety degrees.

38. The system of claim 21, wherein one or more attachment or bend angles defined by the updated integrated circuit layout data are multiples of other than ninety degrees.

* * * * *